(12) United States Patent
Chiron

(10) Patent No.: US 8,611,402 B2
(45) Date of Patent: Dec. 17, 2013

(54) FAST ENVELOPE SYSTEM CALIBRATION

(75) Inventor: Jean-Frederic Chiron, Tournefeuille (FR)

(73) Assignee: RF Micro Devices, Inc., Greensboro, NC (US)

( * ) Notice: Subject to any disclaimer, the term of this patent is extended or adjusted under 35 U.S.C. 154(b) by 75 days.

(21) Appl. No.: 13/363,888

(22) Filed: Feb. 1, 2012

(65) Prior Publication Data
US 2012/0195352 A1 Aug. 2, 2012

Related U.S. Application Data

(60) Provisional application No. 61/438,755, filed on Feb. 2, 2011.

(51) Int. Cl.
H04B 1/38 (2006.01)
H04L 5/16 (2006.01)

(52) U.S. Cl.
USPC ............ 375/219; 375/222; 375/295; 375/297

(58) Field of Classification Search
USPC .................................. 375/219, 222, 295, 297
See application file for complete search history.

(56) References Cited

U.S. PATENT DOCUMENTS

| 4,996,500 | A | 2/1991 | Larson et al. |
| 5,311,309 | A | 5/1994 | Ersoz et al. |
| 5,351,087 | A | 9/1994 | Christopher et al. |
| 5,414,614 | A | 5/1995 | Fette et al. |
| 5,420,643 | A | 5/1995 | Romesburg et al. |
| 5,486,871 | A | 1/1996 | Filliman et al. |
| 5,532,916 | A | 7/1996 | Tamagawa |
| 5,581,454 | A | 12/1996 | Collins |
| 5,646,621 | A | 7/1997 | Cabler et al. |
| 5,715,526 | A | 2/1998 | Weaver, Jr. et al. |
| 5,822,318 | A | 10/1998 | Tiedemann, Jr. et al. |

(Continued)

FOREIGN PATENT DOCUMENTS

| EP | 0755121 A2 | 1/1997 |
| EP | 1492227 A1 | 12/2004 |

(Continued)

OTHER PUBLICATIONS

Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.

(Continued)

Primary Examiner — Ted Wang
(74) Attorney, Agent, or Firm — Withrow & Terranova, P.L.L.C.

(57) ABSTRACT

Disclosed is a transceiver for an envelope following system that includes a power amplifier (PA) having a signal input, a signal output, and a power input that receives power from a power management system that modulates a supply voltage provided to the PA in response to an envelope signal. The transceiver includes a calibration subsystem that is adapted to provide a first test signal to the signal input of the PA and to provide a second test signal to the power management system in place of the envelope signal. The calibration subsystem is programmed with calibration methods that sweep the first test signal through a first range and to sweep the second test signal through a second range in order to derive values that make up a pseudo-envelope look-up table (LUT) that is usable by the transceiver.

22 Claims, 34 Drawing Sheets

(56) References Cited

U.S. PATENT DOCUMENTS

| | | |
|---|---|---|
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,348,780 B1 | 2/2002 | Grant |
| 6,559,689 B1 | 5/2003 | Clark |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,728,163 B2 | 4/2004 | Gomm et al. |
| 6,819,938 B2 | 11/2004 | Sahota |
| 6,995,995 B2 | 2/2006 | Zeng et al. |
| 7,058,373 B2 | 6/2006 | Grigore |
| 7,164,893 B2 | 1/2007 | Leizerovich et al. |
| 7,233,130 B1 | 6/2007 | Kay |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,696,735 B2 | 4/2010 | Oraw et al. |
| 7,715,811 B2 | 5/2010 | Kenington |
| 7,724,837 B2 * | 5/2010 | Filimonov et al. ............ 375/295 |
| 7,773,691 B2 | 8/2010 | Khlat et al. |
| 7,777,459 B2 | 8/2010 | Williams |
| 7,782,036 B1 | 8/2010 | Wong et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,907,010 B2 | 3/2011 | Wendt et al. |
| 7,994,864 B2 | 8/2011 | Chen et al. |
| 8,000,117 B2 | 8/2011 | Petricek |
| 8,008,970 B1 | 8/2011 | Homol et al. |
| 8,026,765 B2 | 9/2011 | Giovannotto |
| 8,068,622 B2 | 11/2011 | Melanson et al. |
| 8,081,199 B2 | 12/2011 | Takata et al. |
| 8,093,951 B1 | 1/2012 | Zhang et al. |
| 8,164,388 B2 | 4/2012 | Iwamatsu |
| 8,174,313 B2 | 5/2012 | Vice |
| 8,198,941 B2 | 6/2012 | Lesso |
| 8,204,456 B2 * | 6/2012 | Xu et al. .................... 455/114.3 |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156662 A1 | 7/2005 | Raghupathy et al. |
| 2005/0157778 A1 | 7/2005 | Trachewsky et al. |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0183532 A1 | 8/2007 | Matero |
| 2007/0259628 A1 | 11/2007 | Carmel et al. |
| 2008/0044041 A1 | 2/2008 | Tucker et al. |
| 2008/0081572 A1 | 4/2008 | Rofougaran |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0167260 A1 | 7/2009 | Pauritsch et al. |
| 2009/0174466 A1 | 7/2009 | Hsieh et al. |
| 2009/0190699 A1 | 7/2009 | Kazakevich et al. |
| 2009/0218995 A1 | 9/2009 | Ahn |
| 2009/0289720 A1 | 11/2009 | Takinami et al. |
| 2009/0319065 A1 | 12/2009 | Risbo |
| 2010/0017553 A1 | 1/2010 | Laurencin et al. |
| 2010/0171553 A1 | 7/2010 | Okubo et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0235827 A1 | 9/2011 | Lesso et al. |
| 2012/0034893 A1 * | 2/2012 | Baxter et al. ............... 455/234.1 |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0170334 A1 | 7/2012 | Menegoli et al. |
| 2012/0176196 A1 | 7/2012 | Khlat |
| 2012/0236444 A1 | 9/2012 | Srivastava et al. |
| 2013/0034139 A1 | 2/2013 | Khlat et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006073208 A1 | 7/2006 |

OTHER PUBLICATIONS

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

International Search Report for PCT/US2011/061007 mailed Aug. 16, 2012, 16 pages.

International Search Report for PCT/US2012/024124 mailed Aug. 24, 2012, 14 pages.

International Search Report for US PCT/US2012/036858 mailed Aug. 9, 2012, 7 pages.

International Search Report for US PCT/US2012/036858 mailed Aug. 10, 2012, 8 pages.

International Search Report for PCT/US2012/023495 mailed May 7, 2012, 13 pages.

(56) References Cited

OTHER PUBLICATIONS

Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Notice of Allowance for U.S. Appl. No. 13/188,024, mailed Jun. 18, 2013, 8 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non-final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm$^e$2 at 81% Efficiency," 2010 IEEE International Solid State Circuits Conference, Feb. 20-24, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873 now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.
International Search Report for PCT/US06/12619 mailed May 8, 2007, 2 pages.
International Search Report for PCT/US2011/061009 mailed Feb. 8, 2012, 14 pages.
Invitation to Pay Additional Fees and Where Applicable Protest Fee for PCT/US2011/061007 mailed Feb. 13, 2012, 7 pages.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
International Search Report for PCT/US2011/064255 mailed Apr. 3, 2012, 12 pages.
Extended European Search Report for application 06740532.4 mailed Dec. 7, 2010, 7 pages.
Choi, J. et al., "A New Power Management IC Architecture for Envelope Tracking Power Amplifier," IEEE Transactions on Microwave Theory and Techniques, vol. 59. No. 7, Jul. 2011, pp. 1796-1802.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/222,484, mailed Aug. 26, 2013, 8 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 131602,856, mailed Sep. 24, 2013, 9 pages.

(56) References Cited

OTHER PUBLICATIONS

Notice of Allowance for U.S. Appl. No. 13/423,649, mailed Aug. 30, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/316,229, mailed Aug. 29, 2013, 8 pages.

* cited by examiner

FAST ENVELOPE SYSTEM CALIBRATION

RELATED APPLICATIONS

This application claims the benefit of provisional patent application Ser. No. 61/438,755, filed Feb. 2, 2011, the disclosure of which is hereby incorporated herein by reference in its entirety.

FIELD OF THE DISCLOSURE

The present disclosure relates to envelope following systems and to methods that allow for fast calibration of envelope following systems in a factory environment.

BACKGROUND

Use of envelope following techniques for linear modulation is highly desirable for long term evolution (LTE) customers and others in the years to come, because envelope following and pseudo-envelope following enables a very efficient use of energy. However, using envelope following techniques adds production line calibration requirements that may become a burden to phone manufacturers due to excessive calibration time overhead. For the purpose of this disclosure, envelope following systems include pseudo-envelope following systems, wherein pseudo-envelope following is envelope tracking that includes power amplifier (PA) collector/drain voltage pre-distortion to ameliorate power amplifier nonlinearity. It should be understood that envelope following is sometimes referred to as envelope tracking by some.

Envelope following systems are power management systems that control power amplifiers (PAs) in such a way that PA collector/drain voltage (referred to herein as Vcc) follows an RF input signal envelope, which is an instantaneous voltage of a PA input RF signal, (referred to herein as VIN). Implementing pseudo-envelope following improves overall efficiency of PA systems because a power management function is realized using high efficiency switcher systems. However, a modulation of collector voltage results in some detrimental side effects due to the physics of transistors. One such detrimental side effect is gain modulation. For example, PA gain depends on Vcc, thus modulating PA collector also voltage modulates PA gain that creates a significant nonlinearity.

Traditionally, the problem of nonlinearity is solved in pseudo-envelope following systems by following a supply voltage/input power (Vcc/PIN) curve for which gain remains constant. The Vcc/PIN curve is known as an isogain curve and a related Vcc/VIN rule is programmed into a special look-up table (LUT) that is included in a phone's transceiver circuitry. What is needed is fast calibration methods that use the phone's transceiver circuitry to relatively quickly complete a calibration procedure that produces results that are usable to generate the special LUT.

SUMMARY

In general, fast pseudo-envelope system calibration methods of the present disclosure are implemented using a calibration subsystem that is relatively autonomous. In this way, time consuming interactions with a production tester on a phone production line are limited.

In particular, the present disclosure provides a transceiver for an envelope following system that includes a power amplifier (PA) having a signal input, a signal output, and a power input that receives power from a power management system that modulates a supply voltage provided to the PA in response to an envelope signal. The transceiver includes the calibration subsystem, which is adapted to provide a first test signal to the signal input of the PA and to provide a second test signal to the power management system in place of the envelope signal. The calibration subsystem is programmed with calibration methods that sweep the first or second test signal through a first range and to sweep the second or first test signal through a second range in order to derive values that make up a pseudo-envelope look-up table (LUT) that is usable by the transceiver.

In at least one embodiment, the transceiver further includes a power measurement circuit adapted to measure power associated with the signal output of the PA as the PA responds to the first test signal and the second test signal. Moreover, the transceiver also includes a memory for storing power measurement data points along with corresponding data points of the first test signal and corresponding data points of the second test signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1A:
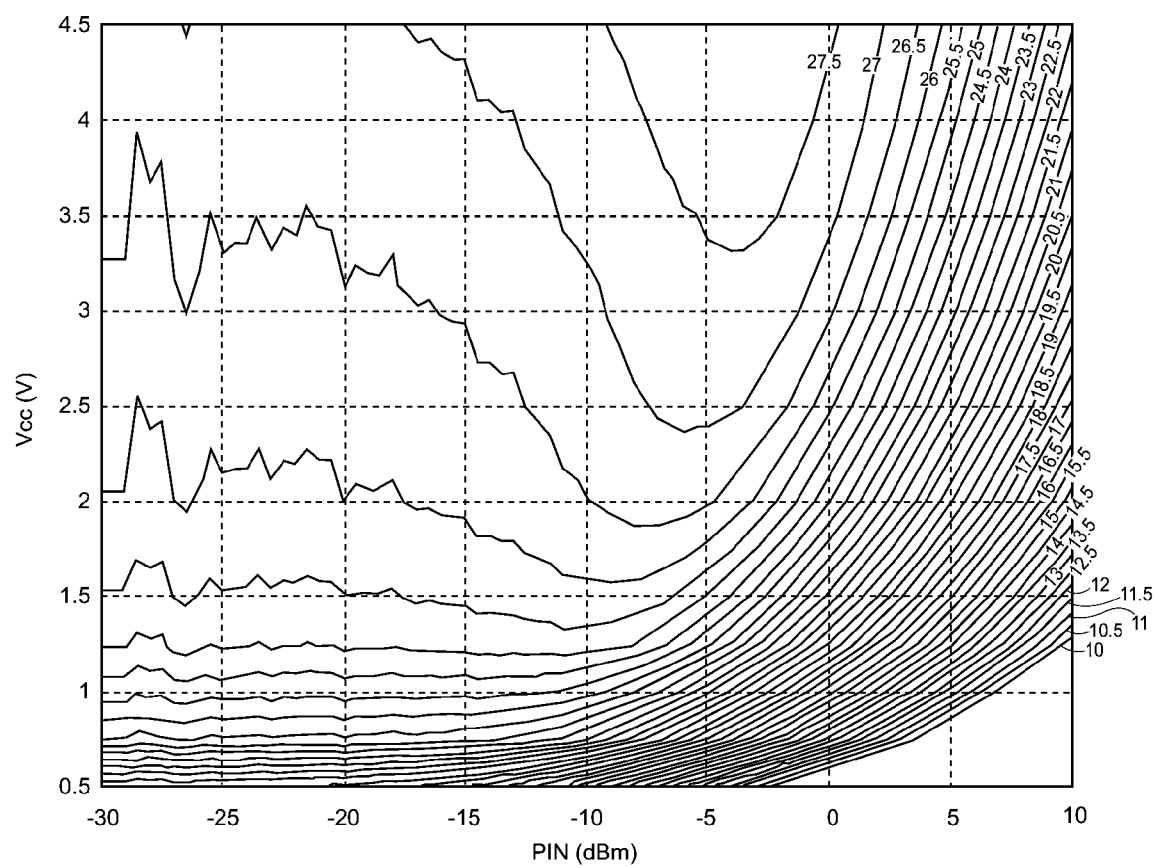
FIG. 1A is a graph of isogain curves for Vcc versus RF input power (PIN).

FIG. 1A is a graph of isogain curves for Vcc versus RF input power (PIN). A vertical axis for Vcc represents a typical voltage range that a power amplifier PA experiences during envelope following. A horizontal axis is scaled in dBm and represents a typical range for PIN. It is to be understood that the scales in this disclosure are typical for low-medium power gallium arsenide (GaAs) heterojunction bipolar transistors (HBT) PAs but not necessarily typical for other types of PAs such as laterally diffused metal oxide semiconductor (LDMOS), power gallium nitride (GaN), and vacuum tubes.

Figure 1B:
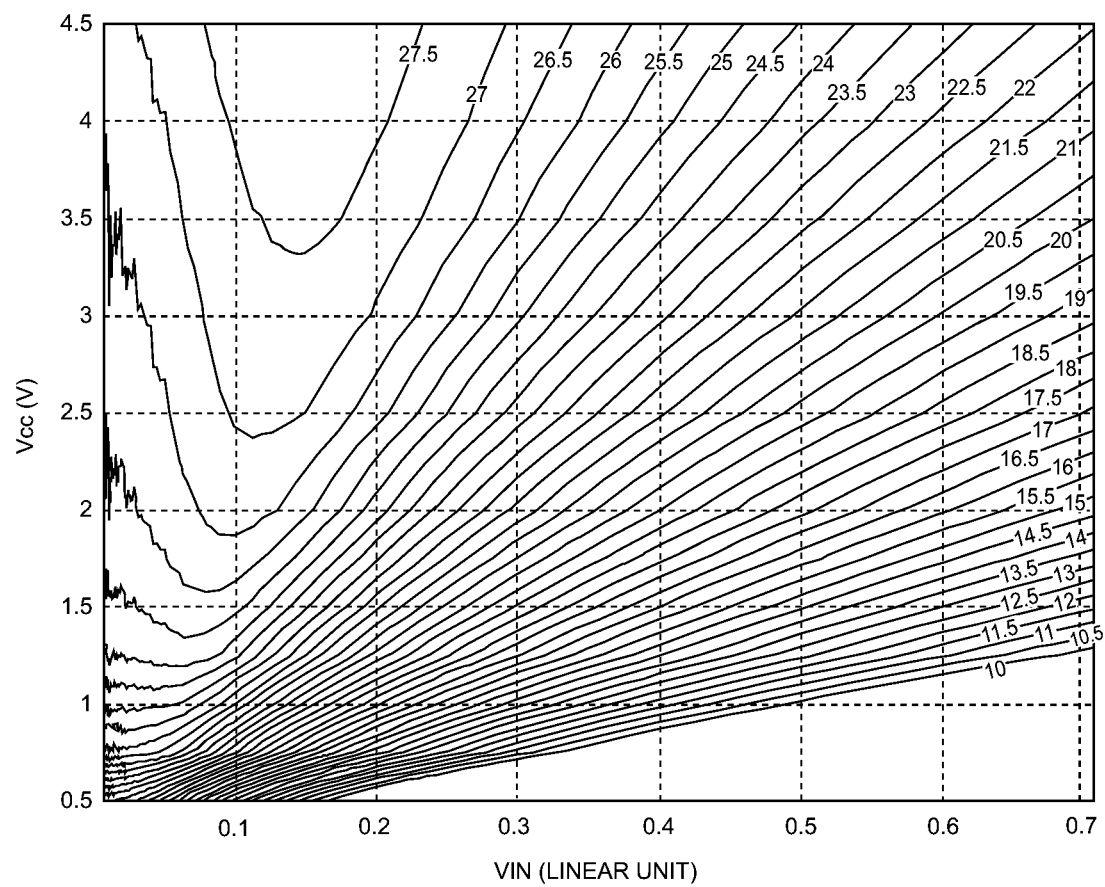
FIG. 1B is a graph of isogain curves for Vcc versus RF input voltage (VIN).

FIG. 1B is a graph of isogain curves for Vcc versus RF input voltage (VIN). A vertical axis for Vcc has the same voltage range as the vertical axis of FIG. 1B, but a horizontal axis is scaled with a linear unit and represents a typical range for VIN for GaAs PAs. Other scales will be typical for other technologies.

Figure 2:
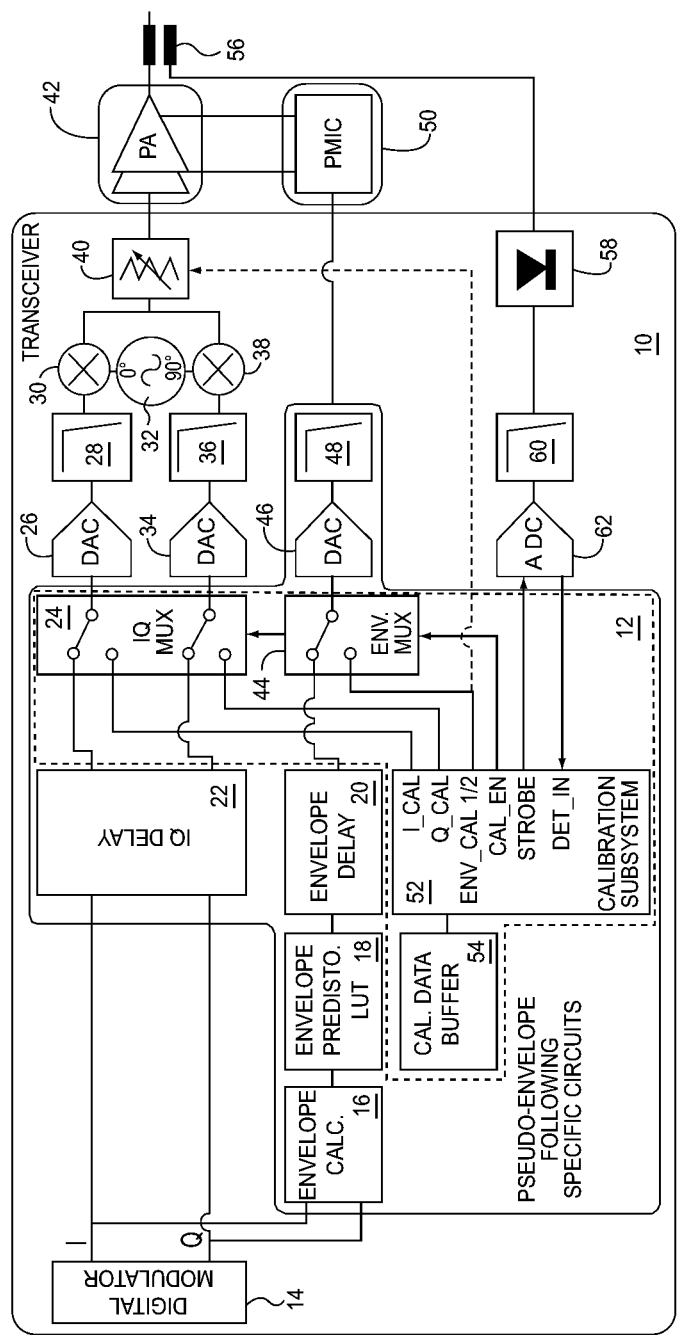
FIG. 2 is a block diagram of a transceiver that incorporates a calibration circuitry that is in accordance with the present disclosure.

FIG. 2 is a block diagram of a transceiver 10 that incorporates a calibration circuitry 12 of the present disclosure. The transceiver 10 includes a digital modulator 14 that generates in-phase (I) and quadrature (Q) signals. The I and Q signals are received by an envelope calculator 16 that calculates absolute (ABS) values that make up a digital envelope signal from the I and Q signals. An envelope pre-distortion look-up table (LUT) 18 is applied to the digital envelope signal, so that the digital envelope signal is pre-distorted before amplification. An envelope delay 20 delays the digital envelope signal after pre-distortion by a programmable amount of time in order to synchronize the digital envelope signal with an RF signal to be amplified.

An IQ delay 22 delays the I and Q signals by a programmable amount of time to ensure that the I and Q signals are synchronized with the pre-distorted envelope signal. An I/Q multiplexer (MUX) 24 selectively switches the I signal to an input of a first digital-to-analog converter (DAC) 26. A first low pass filter 28 filters an analog I signal that is output from the first DAC 26. A first mixer 30 mixes the analog I signal with an in-phase RF signal generated by an oscillator 32.

The I/Q multiplexer 24 also selectively switches the Q signal to an input of a second DAC 34. A second low pass filter 36 filters an analog Q signal that is output from the second DAC 34. A second mixer 38 mixes the analog Q signal with a quadrature RF signal generated by the oscillator 32. Mixers 30 and 38 and the RF source 32 comprise an RF quadrature modulator. It is to be understood that other types of IQ to RF modulators are usable without deviating from the scope of the present disclosure. A programmable attenuator 40 is usable to adjust the amplitude of the RF signal resulting from the mixing of the analog I signal and analog Q signal with the RF signal. A power amplifier (PA) 42 receives and amplifies the RF signal to a desired level.

An envelope multiplexer 44 selectively switches the digital envelope signal to an input of a third DAC 46. A third low pass filter 48 filters an analog envelope signal that is output from the third DAC 46. A power management integrated circuit (PMIC) 50 receives the analog envelope after filtering and uses the analog envelope signal to modulate Vcc that is output to supply PA 42 with power.

A calibration subsystem 52 provides an I calibration signal (I_CAL) and a Q calibration signal (Q_CAL) to the I/Q multiplexer 24. The calibration subsystem 52 also provides a first envelope calibration signal (ENV_CAL 1) to the envelope multiplexer 44 as well as a second envelope calibration signal (ENV_CAL 2) to the programmable attenuator 40.

The calibration subsystem 52 also receives a detector input signal (DET_IN) that is made up of digital values that quantify the output power provided by the PA 42 during a calibration operation. A memory 54 that serves as a calibration data buffer stores the digital values of the DET_IN signal.

A sample of output power is taken from an output of PA 42 using a coupler 56. A power detector 58 detects the sample of output power. The power detector 58 can be, but is not limited to, a diode based detector, a logarithmic amplifier/detector, IQ receiver, and a receiver path, etc. A fourth filter 60 receives and filters a detected power output from the power detector 58. An analog-to-digital converter (ADC) 62 receives the detected power output after filtering. The ADC 62 converts the detected power output into the digital values of the DET_IN signal upon receiving a strobe signal (STROBE) from the calibration subsystem 52. It is to be understood that the calibration subsystem 52 can be implemented in hardware and or software on transceiver 10 and/or on a baseband processor (not shown).

Figure 3:
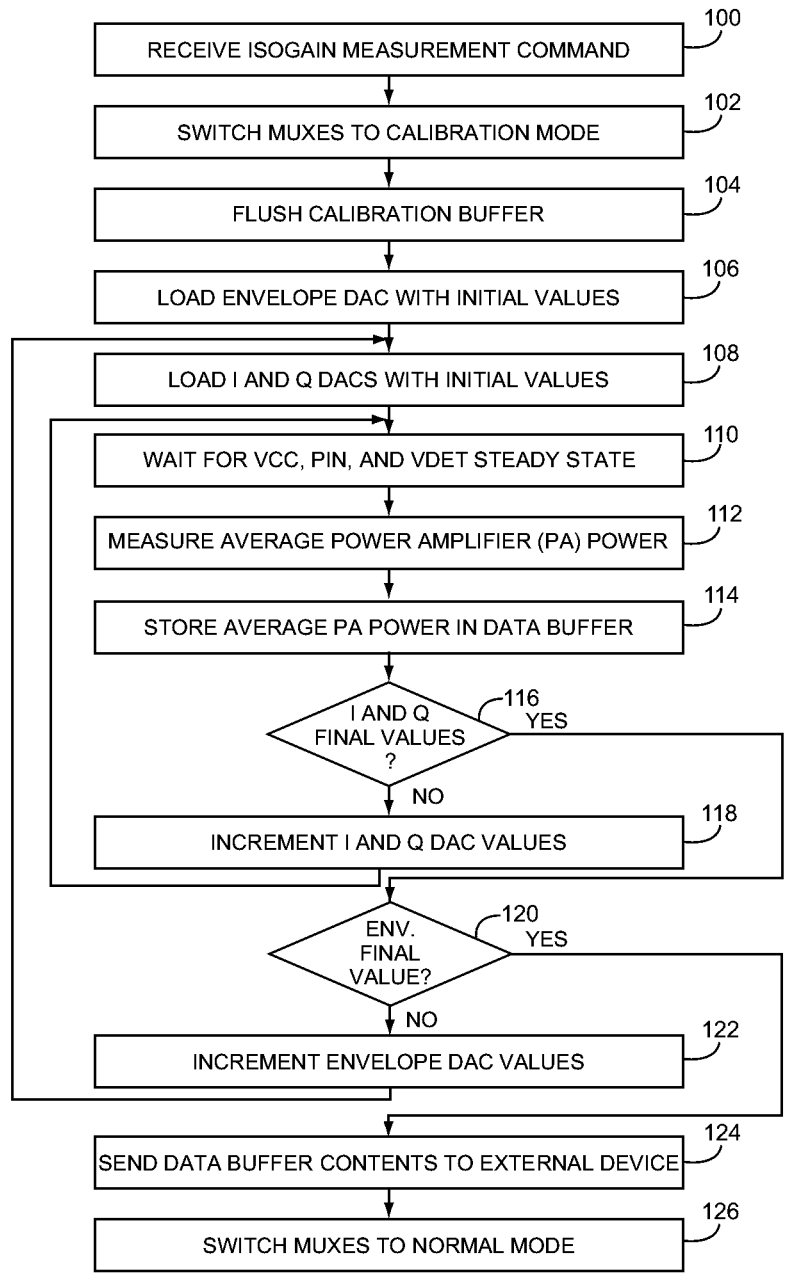
FIG. 3 is a flowchart of a two dimensional (2D) sweep algorithm that is executable by the calibration subsystem (FIG. 2).

FIG. 3 is a flowchart of a two dimensional (2D) sweep algorithm that is executable by the calibration subsystem 52 (FIG. 2). The 2D sweep algorithm begins after an isogain measurement command is received by a phone (not shown) that includes the calibration subsystem 52 (step 100). The calibration subsystem 52 switches the I/Q multiplexer 24 and the envelope multiplexer 44 from a normal mode to a calibration mode (step 102). The normal mode transmits I and Q values from the digital modulator 14 while transmitting envelope values from the envelope calculator 16. The calibration mode transmits I and Q calibration values and envelope calibration values from the calibration subsystem under control of the 2D sweep algorithm.

The calibration data buffer 54 (FIG. 2) is flushed to clear old data in preparation of storing new data (step 104). The third DAC 46 (FIG. 2) that serves as an envelope DAC is loaded with initial values (step 106). The first DAC 26 (FIG. 2) that serves as an I DAC is loaded with an initial I value and the second DAC 34 (FIG. 2) that serves as a Q DAC is loaded with an initial Q value (step 108). Next, the 2D sweep algorithm waits for Vcc, PIN and a detector voltage (VDET) to reach steady state (step 110). Once steady state is reached, the average PA power is measured (step 112). The average PA power is then stored in the data buffer 54 (FIG. 2) (step 114).

Next, the 2D sweep algorithm determines if final values for I and Q have been processed (step 116). If no, then the I and Q DAC values are incremented (step 118) and steps 110, 112, 114, and 116 are repeated. If yes, the 2D sweep algorithm determines if the final envelope value has been processed (step 120). If no, the envelope DAC values are incremented (step 122) and steps 108, 110, 112, 114, and 116 are repeated. In one embodiment, the envelope data value and the I and Q DAC values are incremented linearly, and in another embodiment, the envelope data value and the I and Q DAC values are incremented exponentially.

If the final envelope value is determined to have been processed (step 120), then the contents of the calibration data buffer 54 is transferred to an external device (not shown) (step 124). The calibration subsystem 52 switches the I/Q multiplexer 24 and the envelope multiplexer 44 from the calibration mode to the normal mode (step 126).

Figure 4A:
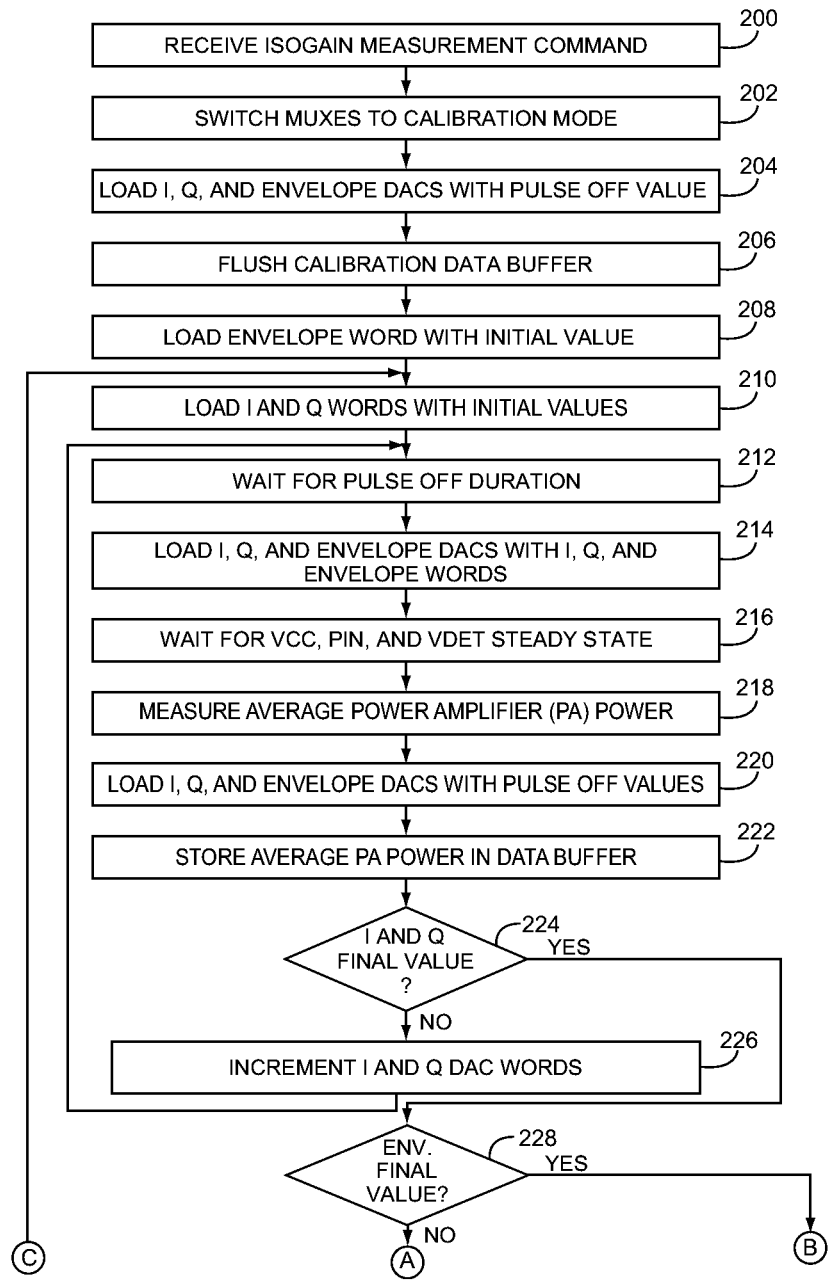
FIGS. 4A and 4B depict a flowchart of a pulsed RF 2D sweep algorithm that is executable by the calibration subsystem (FIG. 2).
Figure 4B:
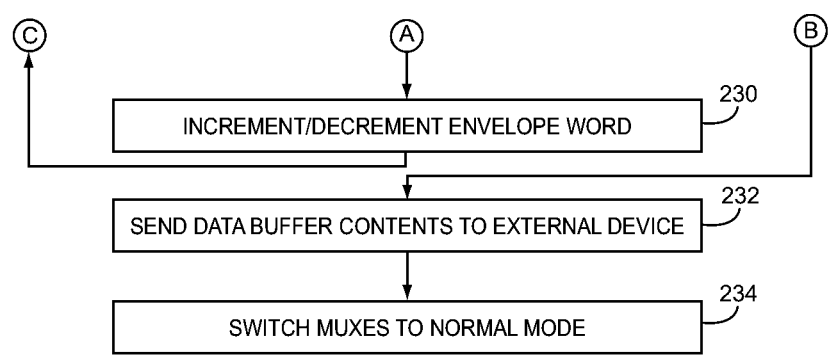

FIGS. 4A and 4B depict a flowchart of a pulsed RF 2D sweep algorithm that is executable by the calibration subsystem (FIG. 2). In a first step an isogain measurement command is received (step 200). Next, the calibration subsystem 52 switches the I/Q multiplexer 24 and the envelope multiplexer 44 from a normal mode to a calibration mode (step 202). The calibration subsystem then loads the I, Q, and envelope DACs with pulse off values (step 204). The calibration data buffer 54 is flushed (step 206). The word for the envelope DAC is loaded with an initial value (step 208). Next, the I and Q words are loaded with initial values (step 210). The pulsed RF 2D sweep algorithm then waits for a pulse off duration (step 212).

Next, the I, Q, and envelope DACs are loaded with I, Q, and envelope words (step 214). A delay then waits for $V_{CC}$, PIN and VDET to reach steady state (step 216). After the delay, the average PA power is measured (step 218). Then the I, Q, and envelope DACs are loaded with pulse off values (step 220). The average PA power value is then stored in the calibration data buffer 54 (step 222).

The pulsed RF 2D sweep algorithm then determines if the final I and the final Q value have been processed (step 224). If no, the I and Q DAC words are incremented (step 226) and the steps 212, 214, 216, 218, 220, 222, and 224 are repeated. If yes, the pulsed RF 2D algorithm determines if the final envelope value has been processed (step 228). If no, the envelope word is incremented or decremented depending on the direction of the sweep (step 230) and the steps 210 through 224 are repeated until the final I and Q values are processed. The pulsed RF 2D sweep algorithm then determines if the final envelope value has been processed (step 228). If yes, the contents of the calibration data buffer 54 are sent to an external device (step 232) and the envelope multiplexer 44 is switched from the calibration mode to the normal mode (step 234).

Figure 5:
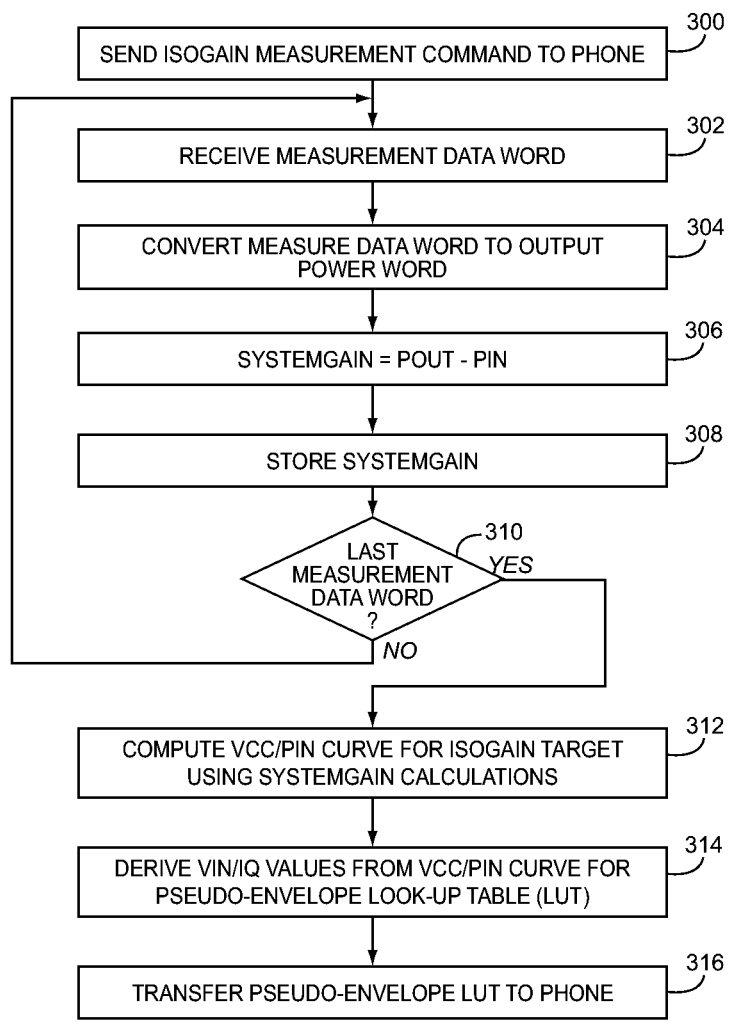
FIG. 5 is a flow chart of a pseudo-envelope generating algorithm that processes PA power measurement data collected by the 2D sweep algorithm of FIG. 3.

FIG. 5 is a flow chart of a pseudo-envelope LUT generating algorithm that processes PA power measurement data collected by the 2D sweep algorithm of FIG. 3 or FIGS. 4A and 4B. In a first step, the pseudo-envelope LUT generating algorithm sends an isogain measure command to a phone that includes the calibration subsystem 52 (step 300). During the completion of the 2D sweep algorithm, the pseudo-envelope LUT generating algorithm receives a measurement data word from the 2D sweep algorithm (step 302). The measurement data word is then converted to an output power word using detector calibration data (step 304). A SYSTEMGAIN is calculated as POUT minus PIN, wherein SYSTEMGAIN, POUT and PIN are scaled in decibels (dB) (step 306). The SYSTEMGAIN is stored in a memory (step 308).

The pseudo-envelope generating algorithm then determines if a last measurement data word has been processed (step 310). If no, then another measurement data word is received 302, and steps 304, 306, 308, and 310 are repeated. If a last measurement data word is determined to have been processed (step 310), then a Vcc/PIN curve for an isogain target is computed using SYSTEMGAIN calculations (step 312). Next, VIN/IQ values from the Vcc/PIN curve are derived to generate a pseudo-envelope look-up table (LUT) (step 314). The pseudo-envelope LUT is then transferred to a phone that includes the calibration subsystem 52 (FIG. 2) (step 316).

Figure 6:
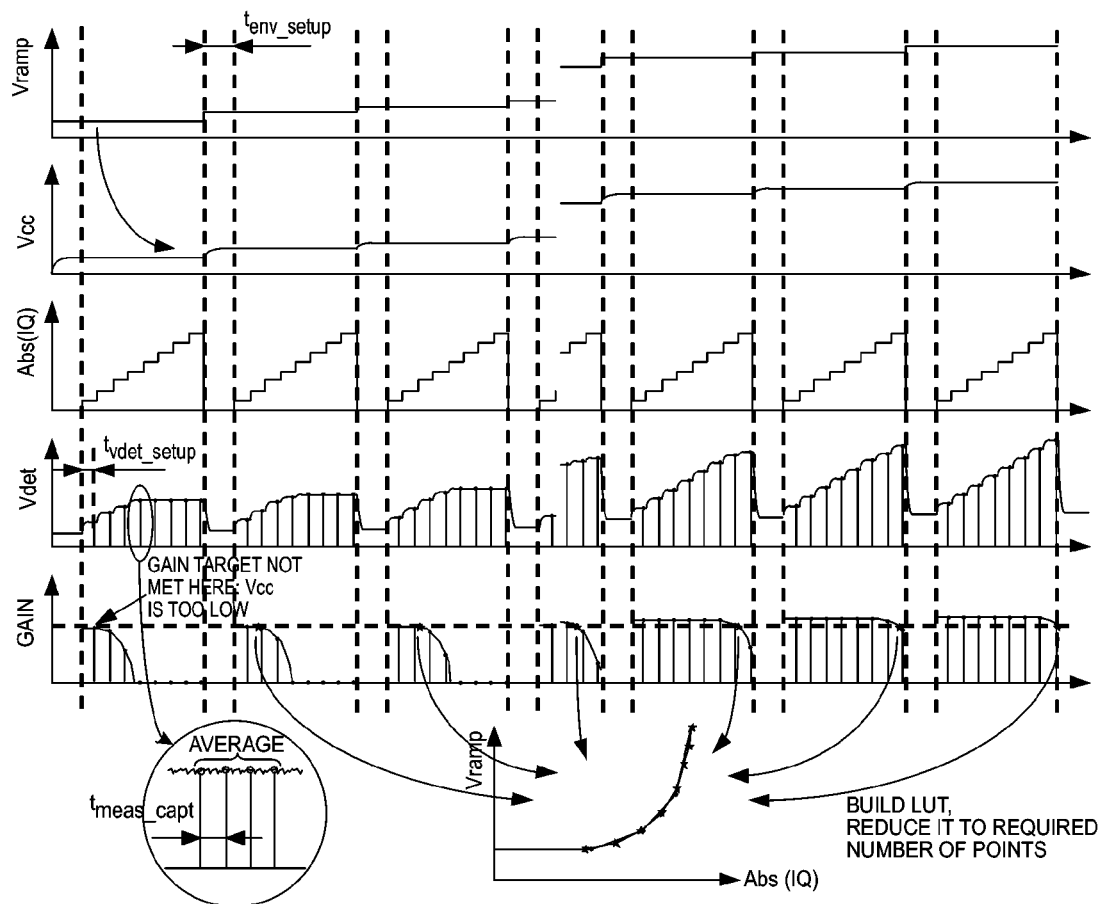
FIG. 6 is a diagram of waveforms generated using the non-pulse RF 2D sweep algorithm of FIG. 3, FIGS. 4A and 4B.

FIG. 6 is a diagram of waveforms generated using the non-pulse RF 2D sweep algorithm of FIG. 3. The voltage Vcc follows an envelope voltage known as Vramp. The voltage VIN is generated by taking the absolute values of the digital I signal and the digital Q signal (ABS(IQ)). The detector voltage VDET is averaged by the non-pulsed RF 2D sweep algorithm of FIG. 3. In at least one embodiment a predetermined number of VDET measurement are captured and then averaged. In this way, a significant amount of measurement noise that is sampled will be decreased in amplitude by the averaging. A sequence of SYSTEMGAIN calculations is used to derive the values of a pseudo-envelope LUT. The SYSTEMGAIN calculations are performed while implementing the pseudo-envelope generating algorithm of FIG. 5. The system gain is represented on the same time axis as the other signals only for illustration. It is to be understood that the averaging, SYSTEMGAIN calculations as well as LUT generation can be postponed until all power measurements are completed.

Figure 7:
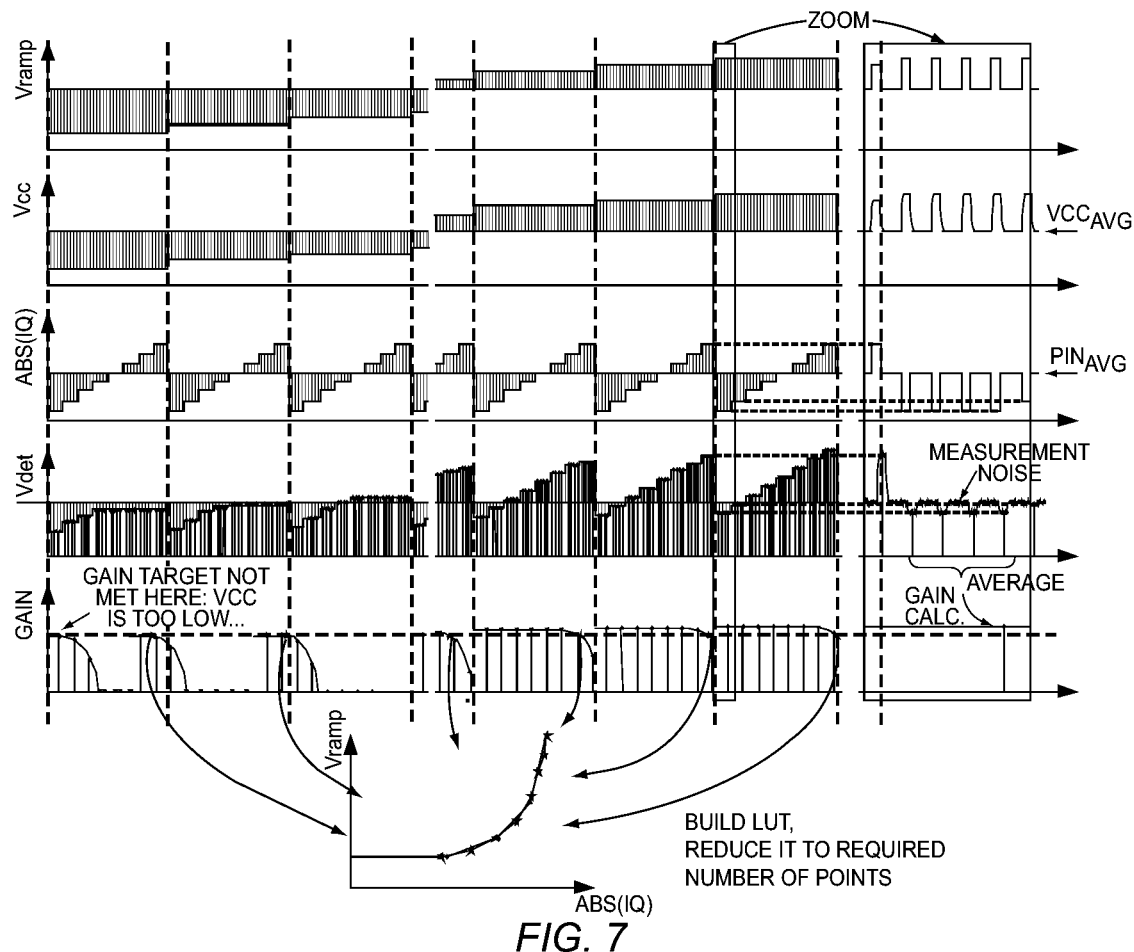
FIG. 7 is a diagram of waveforms generated using a pulsed RF 2D sweep algorithm in accordance with the present disclosure.

FIG. 7 is a diagram of waveforms generated using the pulsed RF 2D sweep algorithm of FIGS. 4A and 4B. The voltage Vcc follows an envelope voltage Vramp. The voltage VIN is generated by taking the absolute values of the digital I signal and the digital Q signal (ABS(IQ)). An average Vcc ($Vcc_{AVG}$) and an average PIN ($PIN_{AVG}$) are selected such that an average PA power output is relatively close to a desired calibrated output power. In this way, junction temperatures of the PA 42 (FIG. 2) are significantly the same for both calibration and normal operation. In at least one embodiment, average values are applied to the DACs during the pulse off duration of the 2D sweep algorithm.

A zoomed portion of the waveforms is shown to the right of the waveforms. Notice that the Vramp signal, the Vcc signal and the ABS(IQ) signal is made up of a series of pulses. The detector voltage VDET is averaged by the pulsed RF 2D sweep algorithm of FIGS. 4A and 4B. In this way, a significant amount of measurement noise that is sampled will be decreased in amplitude by the averaging. A sequence of SYSTEMGAIN calculations is used to derive the values of a pseudo-envelope LUT. The SYSTEMGAIN calculations are performed while implementing the pseudo-envelope generating algorithm of FIG. 5. Therefore, the SYSTEMGAIN calculations are shown on the same axis as the other waveforms for illustrative purposes only. It is to be understood that the averaging, SYSTEMGAIN calculations as well as LUT generation can be postponed until all power measurements are completed.

Figure 8A:
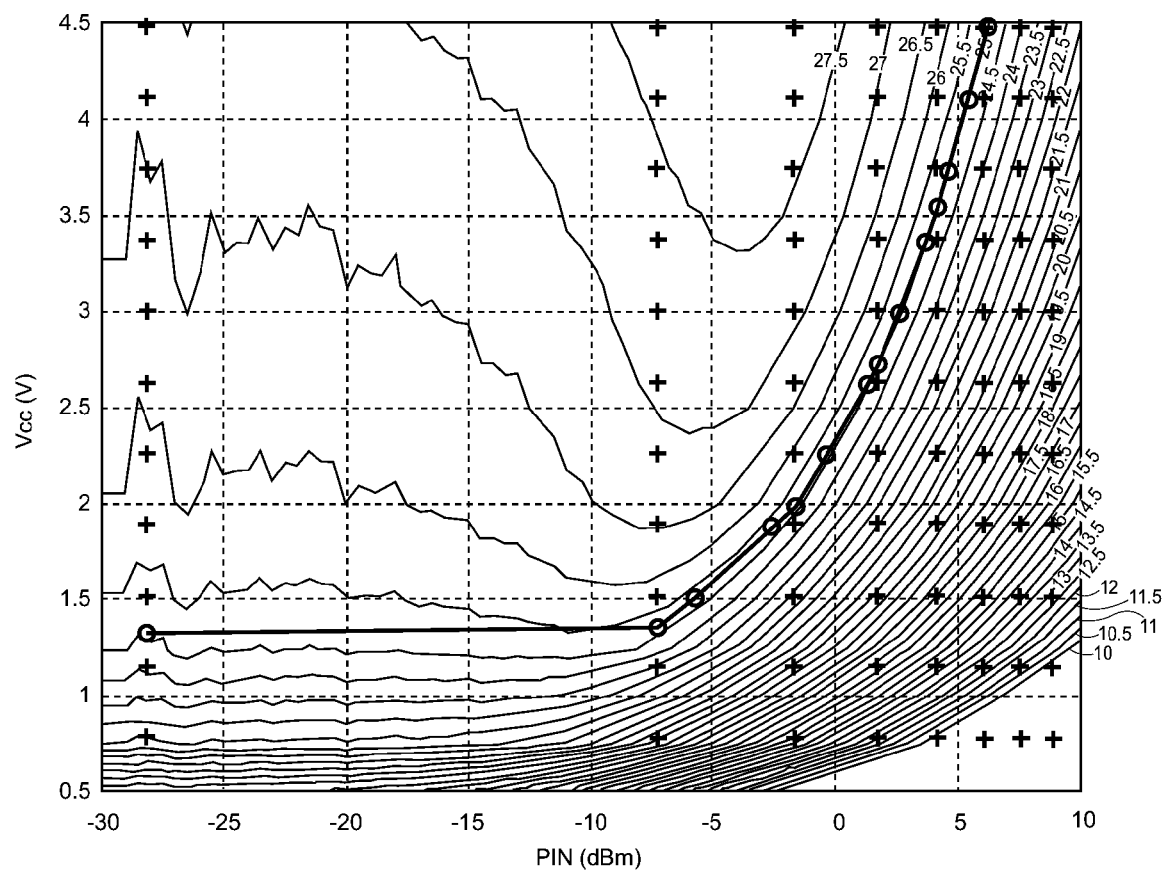
FIG. 8A is a graph of isogain curves for Vcc versus RF input power (PIN) including a Vcc/VIN linear 2D sweep point distribution.
Figure 8B:
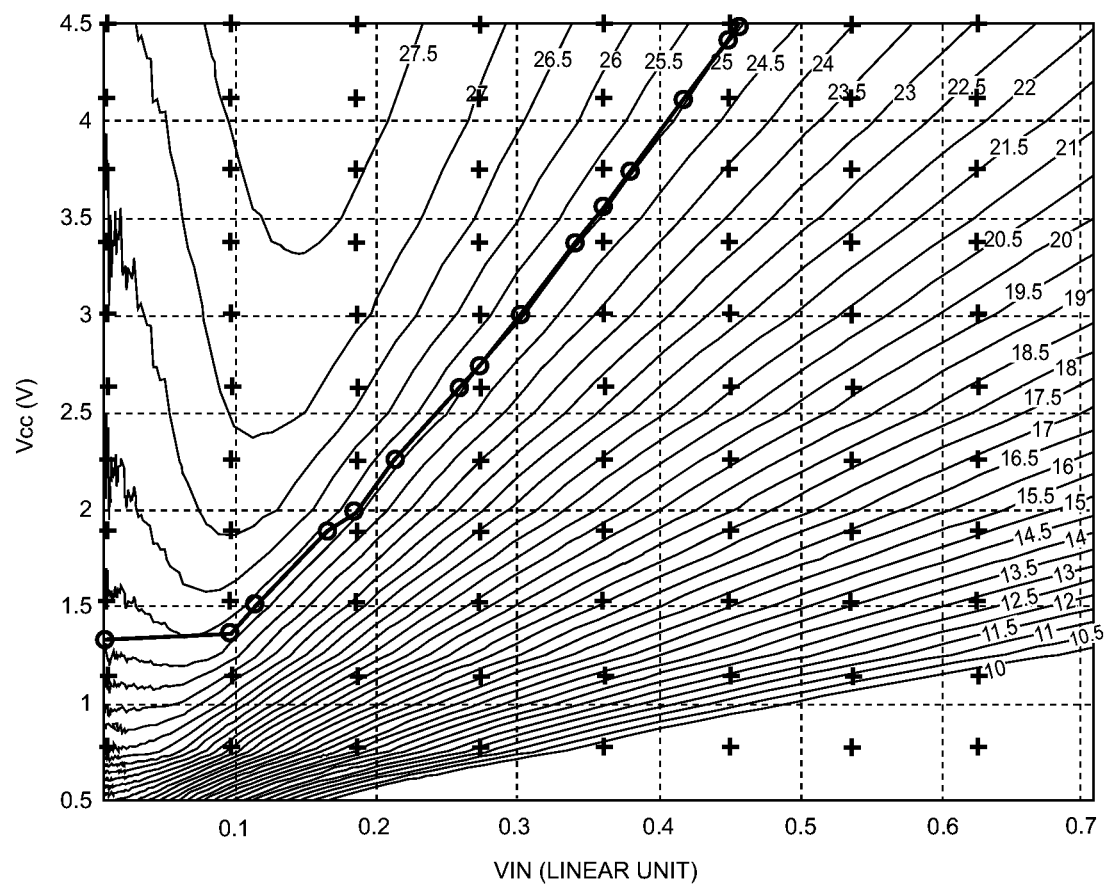
FIG. 8B is a graph of isogain curves for Vcc versus RF input voltage (VIN) including a Vcc/VIN linear 2D sweep point distribution.

FIG. 8A is a graph of isogain curves for Vcc versus RF input power (PIN) including a linear sweep point distribution. FIG. 8B is a graph of isogain curves for Vcc versus RF input voltage (VIN) including a linear sweep point distribution. Bold "+" signs represent locations of measurements made automatically using the 2D sweep algorithm of FIG. 3 or FIGS. 4A and 4B. An isogain curve highlighted as a thick dark line with data points represented by circles is a preferred Vcc/PIN curve to be defined in a pseudo-envelope LUT.

Due to the nature of isogain curves, Vcc is relatively proportional to the input voltage VIN when the PA 42 (FIG. 2) is operated at relatively high Vcc voltages. As a result, the transceiver 10 (FIG. 2) behaves similar to a traditional envelope following transceiver when relatively high Vcc voltages are applied to the PA 42 and only a few calibration measurements are needed in this Vcc range. In contrast, when Vcc is significantly reduced, the gain of the PA 42 begins to reduce nonlinearly. Consequently, a linear following of the Vcc/VIN is no longer possible. In particular, this is a region of the isogain graph in which the pseudo-envelope following of the present disclosure differs from traditional envelope following. In this area, a density of isogain measurements needs to be increased so that an interpolated Vcc/VIN curves accurately fits an actual power curve of the PA 42.

Referring to both FIGS. 8A and 8B, it can be seen that the Vcc and VIN/PIN sweeps are not as accurate as they could be because the density of isogain measurements is too high in a less critical area and too low in a more critical area to provide a good estimate of the isogain curve in the more critical area. Therefore, the density of isogain measurements should be increased in the more critical area and reduced in the less critical area.

Figure 9A:
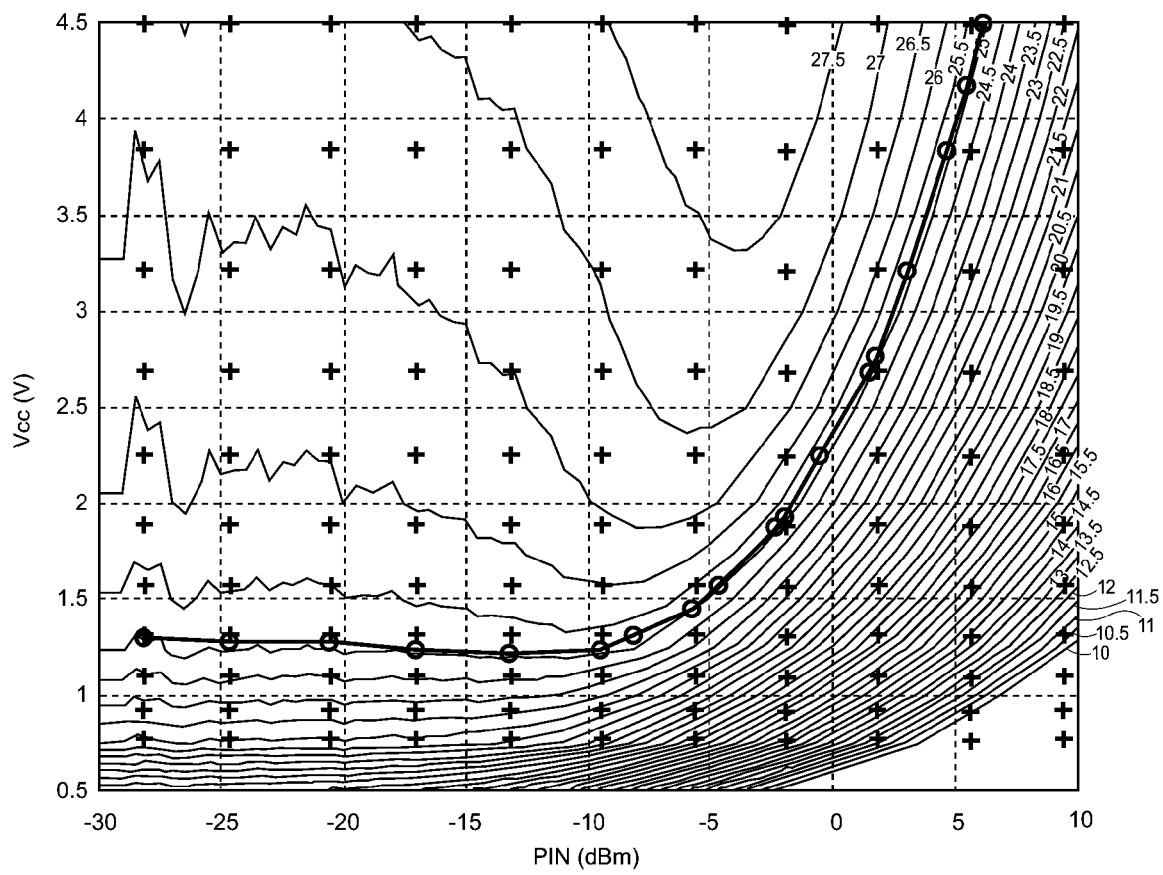
FIG. 9A is a graph of isogain curves for Vcc versus RF input power (PIN) including Vcc/VIN exponential 2D sweep point distribution.
Figure 9B:
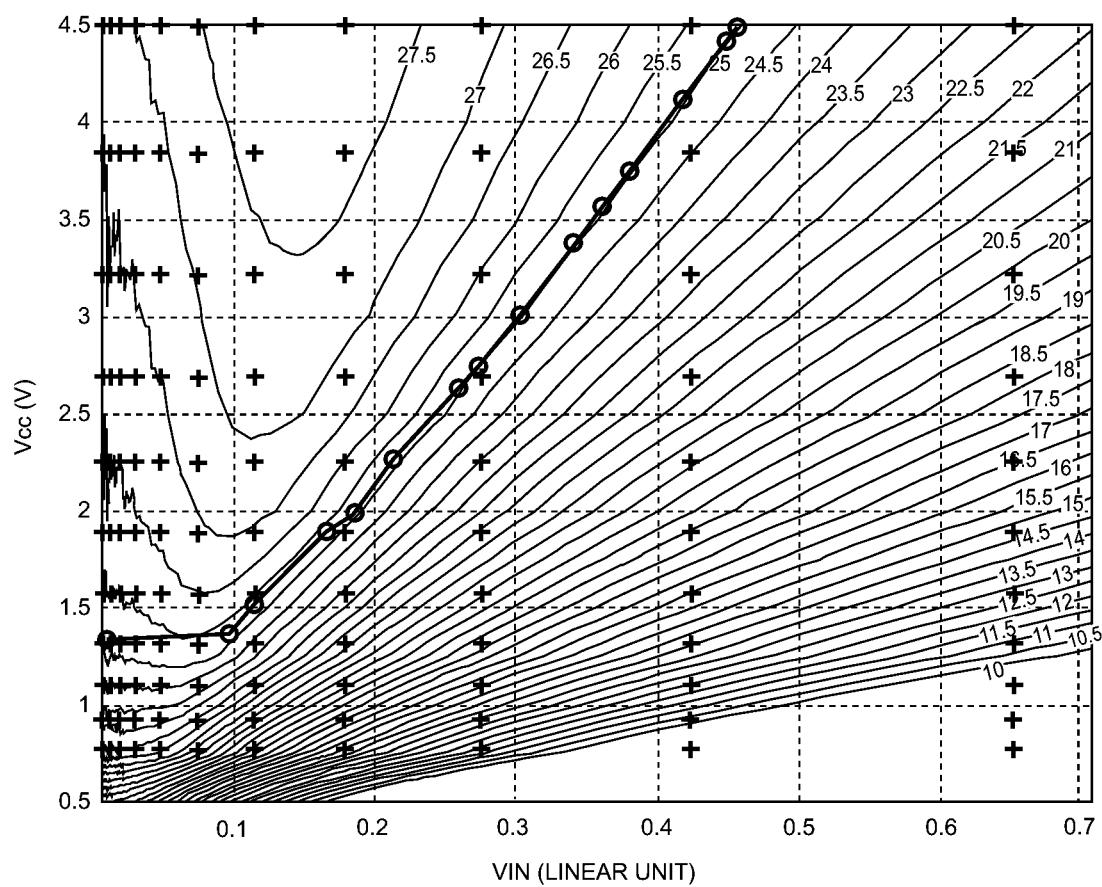
FIG. 9B is a graph of isogain curves for Vcc versus RF input voltage (VIN) including Vcc/VIN exponential 2D sweep point distribution.

FIGS. 9A and 9B are isogain curves for which exponential sweeps are used to provide a higher density of isogain measurements in the more critical area. To perform the exponential sweeps, a value of increment for DAC values is multiplied by a constant upon every increment of the exponential sweeps.

Figure 10A:
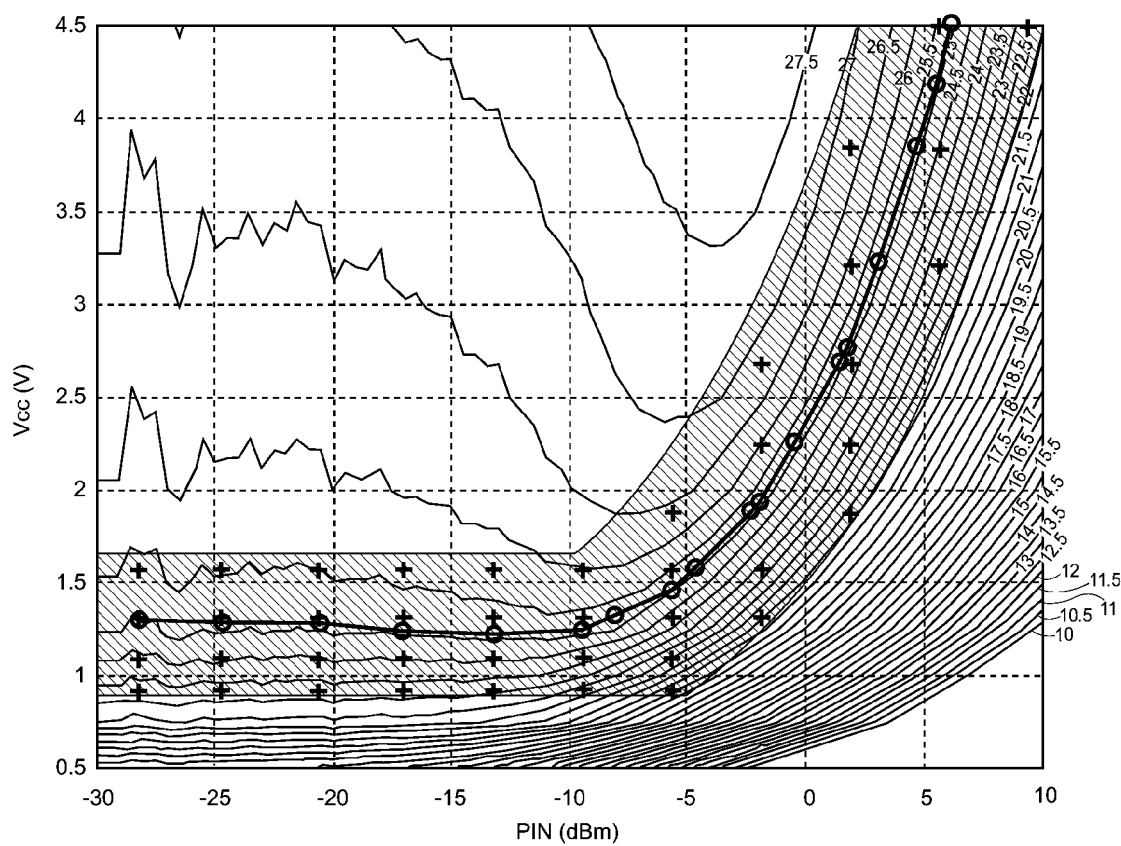
FIG. 10A is a graph of isogain curves for Vcc versus RF input power (PIN) including a bounded exponential sweep point distribution.
Figure 10B:
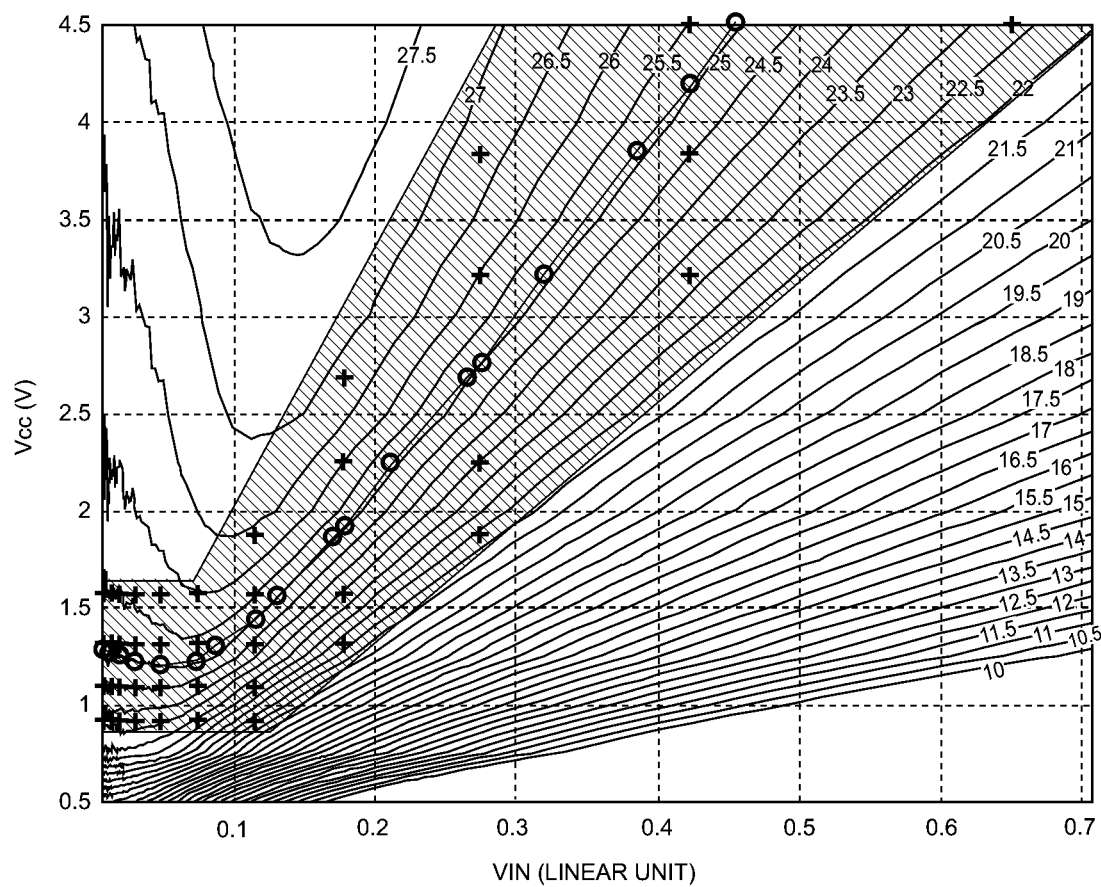
FIG. 10B is a graph of isogain curves for Vcc versus RF input voltage (VIN) including a bounded exponential sweep point distribution.

FIGS. 10A and 10B are bounded exponential sweeps that further reduce the number of measured [Vcc, VIN] points needed to generate an accurate pseudo-envelope LUT. The bounded areas are hatched in both FIGS. 10A and 10B. Areas outside of the bounded areas do not include any VDET/Gain measurements. As a result, the 2D algorithm of FIG. 3 does not excessively waste measurement time while performing the VDET/Gain measurements needed to accurately generate a pseudo-envelope LUT. Thus, fast envelope calibration is achieved by implementing the 2D algorithm using bounded exponential sweeps.

Two-segment piecewise linear Vcc(VIN) functions are usable to keep a definition of boundaries for the bounded areas simple to allow a cost effective silicon implementation of the 2D algorithm. In operation, an exponential sweep begins at one boundary and stops at another.

Figure 11:
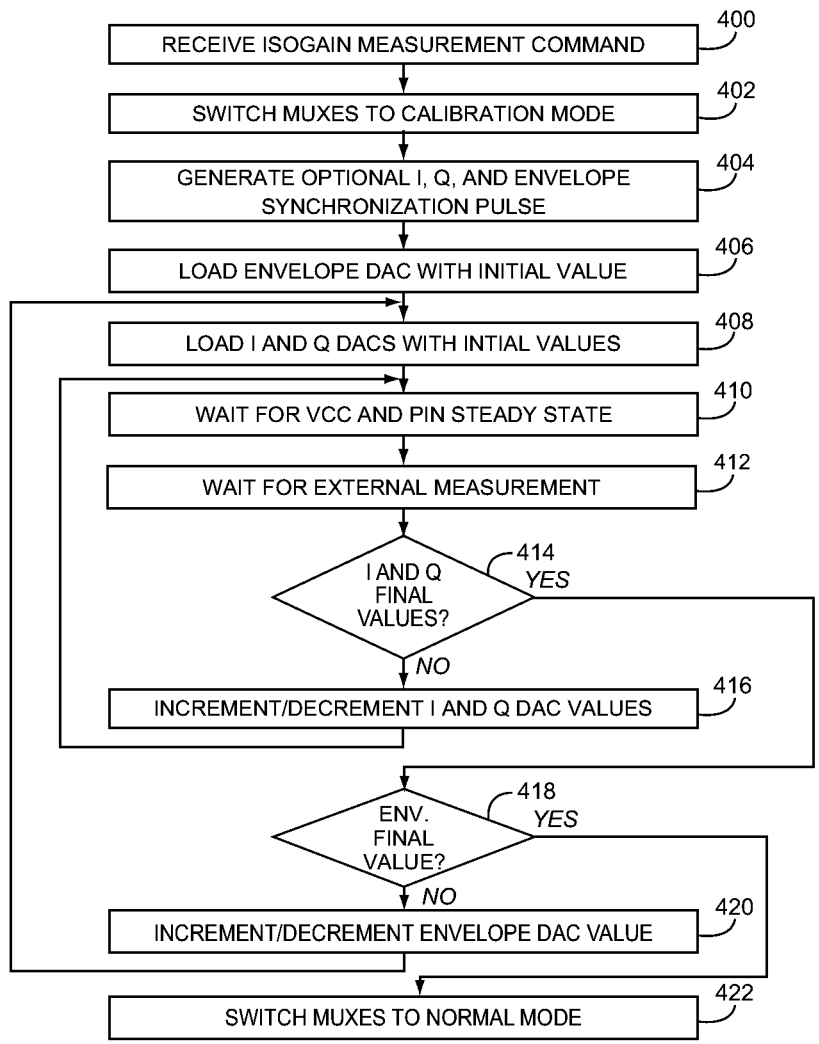
FIG. 11 is a flowchart of a 2D sweep algorithm that sweeps envelope DAC values, I DAC values, and Q DAC values without making power measurements.

FIG. 11 is a flowchart of another two dimensional (2D) sweep algorithm that is executable by the calibration subsystem 52 (FIG. 2) without making any power measurement when a power detector is not available in the transceiver. The 2D sweep algorithm begins after an isogain measurement command is received by a phone (not shown) that includes the calibration subsystem 52 (step 400). The calibration subsystem 52 switches the I/Q multiplexer 24 and the envelope multiplexer 44 from a normal mode to a calibration mode (step 402). The normal mode transmits I and Q values from the digital modulator 14 while transmitting envelope values from the envelope calculator 16. The calibration mode transmits a first test signal made up of I and Q calibration values and a second test signal made up of envelope calibration values from the calibration subsystem under control of the 2D sweep algorithm. This particular 2D sweep algorithm may be configured to generate an optional I, Q, and envelope synchronization pulse (step 404). This optional pulse can be used to trigger external test equipment for PA output power measurements.

The third DAC 46 (FIG. 2) that serves as an envelope DAC is loaded with an initial value (step 406). The first DAC 26 (FIG. 2) that serves as an I DAC is loaded with an initial I value and the second DAC 34 (FIG. 2) that serves as a Q DAC is loaded with an initial Q value (step 408). The 2D algorithm waits for Vcc and PIN to reach steady state (step 410) and waits an additional period to ensure that external test equipment has time to complete an external measurement (step 412).

The 2D sweep algorithm then determines if final values for I and Q have been processed (step 414). If no, then the I and Q DAC values are incremented or decremented depending on a desired sweep direction (step 416) and steps 410, 412, and 414 are repeated. The 2D sweep algorithm then determines if a final envelope value has been processed (step 418). If no, the envelope DAC value is incremented or decremented depending on the desired sweep direction (step 420) and the steps 406 through 414 are repeated. If the final envelope value is determined to have been processed (step 418), then the calibration subsystem 52 switches the I/Q multiplexer 24 and the envelope multiplexer 44 from the calibration mode to the normal mode (step 422). In one embodiment, the envelope data value and the I and Q DAC values are incremented linearly, and in another embodiment, the envelope data value and the I and Q DAC values are incremented exponentially.

Executing the sweeps from maximum values down to minimum values is another way to trigger the external test equipment.

Figure 12A:
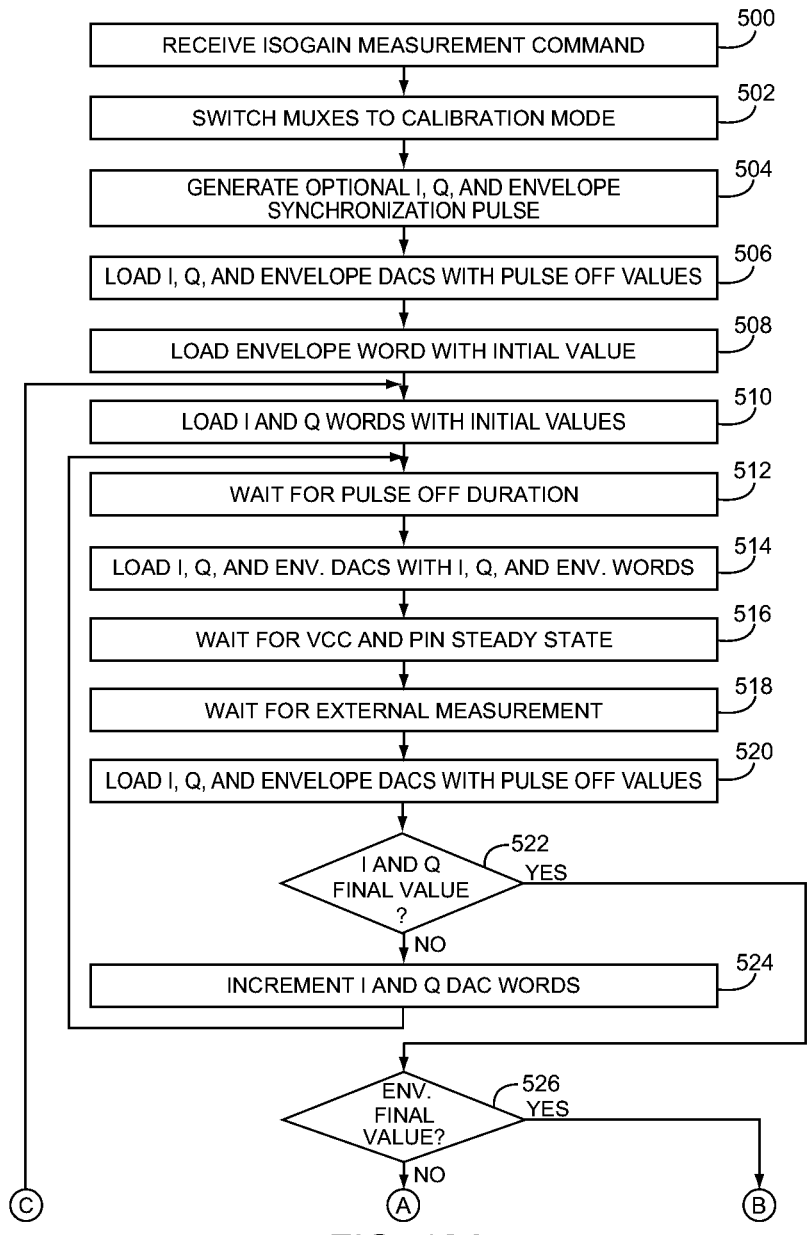
FIGS. 12A and 12B depict a flowchart of a pulsed RF 2D sweep algorithm without making power measurements.
Figure 12B:
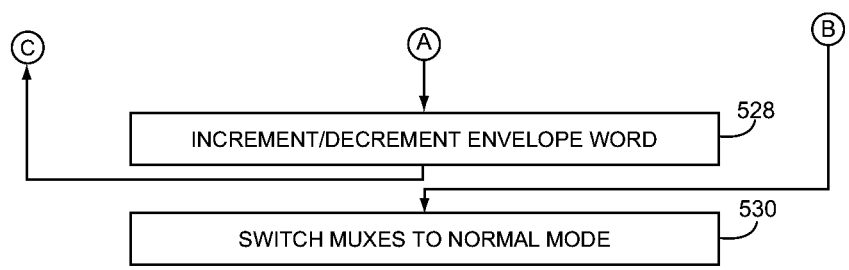

FIGS. 12A and 12B depict a flowchart of a pulsed 2D sweep algorithm without making power measurements when a power detector is not available on the transceiver. In a first step an isogain measurement command is received (step 500). Next, the calibration subsystem 52 switches the I/Q multiplexer 24 and the envelope multiplexer 44 from a normal mode to a calibration mode (step 502). The calibration subsystem may then generate an optional I, Q, and envelope synchronization pulse (step 504). Next, the I, Q and envelope DACs are loaded with a pulse off value (step 506). The envelope word is then loaded with an initial value (Step 508). The I and Q words are then loaded with initial values (Step 510). Next, the pulsed 2D sweep algorithm waits for a pulse off duration determined by the pulse off value (step 512). The I, Q, and envelope DACs are also loaded with I, Q, and envelope words (step 514). The pulsed 2D algorithm waits for Vcc and PIN to reach steady state (step 516) and waits an additional period to ensure that external test equipment has time to complete an external measurement (step 518). The I, Q, and envelope DACs are loaded with pulse off values (step 520). Executing the sweeps from maximum values down to minimum values is another way to trigger the external test equipment.

The pulsed RF 2D sweep algorithm then determines if the final I and final Q value have been processed (step 522). If no, the I and Q DAC words are incremented (step 524) and the steps 512, 514, 516, 518, 520, and 522 are repeated. The pulsed RF 2D sweep algorithm then determines if the final envelope value has been processed (step 526). If no, the envelope word is incremented or decremented depending on the direction of the envelope sweep (step 528) and the steps 510 through 522 are repeated. If yes, the envelope multiplexer 44 is switched from the calibration mode to the normal mode (step 530).

Figure 13:
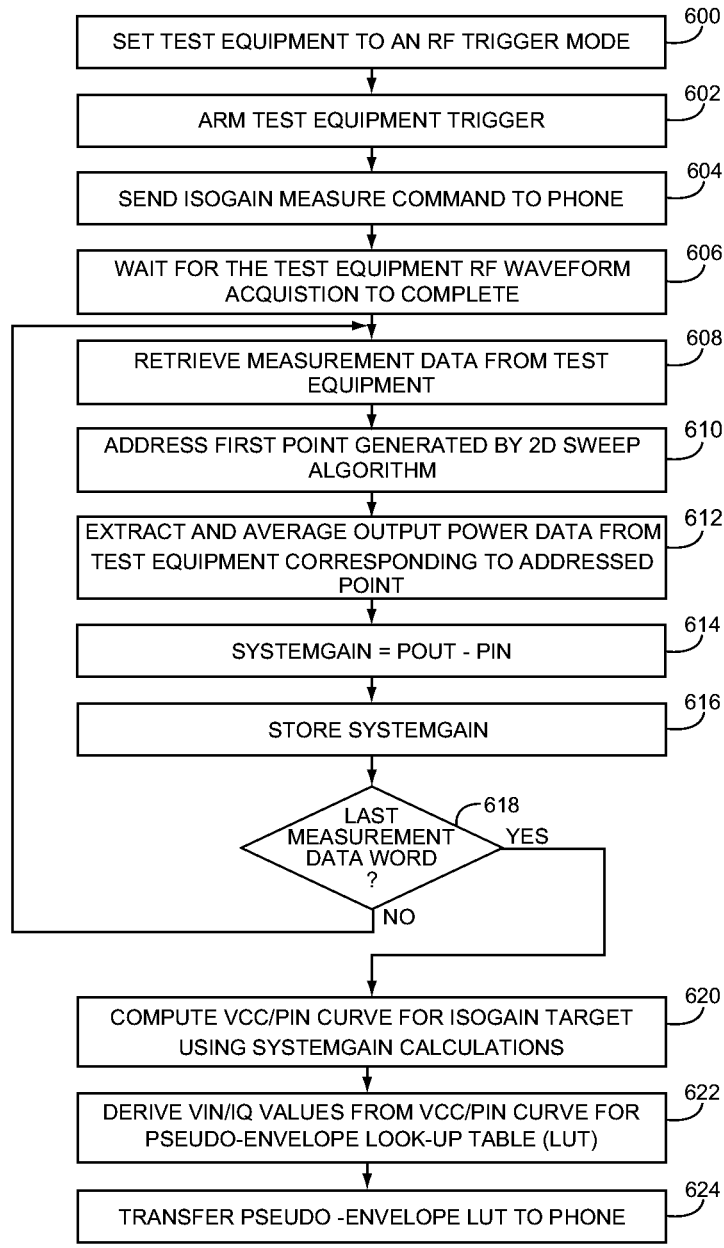
FIG. 13 is a flow chart of a pseudo-envelope generating algorithm that processes PA power measurement data collected with the aid of the 2D sweep algorithm of FIGS. 11, 12A, and 12B.

FIG. 13 is a flow chart of a pseudo-envelope LUT generating algorithm that processes PA power measurement data collected with the aid of the 2D sweep algorithm of FIGS. 11, 12A, and 12B. In a first step, the pseudo-envelope LUT generating algorithm sets an RF trigger mode for test equipment that will measure power transmitted from a phone that includes the calibration subsystem 52 and is undergoing a fast pseudo-following calibration (step 600). Next, the pseudo-envelope LUT generating algorithm arms the test equipment's trigger (step 602). The pseudo-envelope generating algorithm then sends an isogain measure command to the phone undergoing the fast pseudo-following calibration (step 604). The pseudo-envelope LUT generating algorithm waits for the test equipment RF waveform acquisition to complete (step 606).

During the completion of the 2D sweep algorithm (FIG. 11), the pseudo-envelope generating algorithm retrieves a measurement data word from the test equipment (step 608). Next, a first point generated by the 2D sweep algorithm is addressed (step 610). Output power data from the test equipment corresponding to the addressed point is then extracted and averaged (step 612). A SYSTEMGAIN is calculated as POUT minus PIN, wherein SYSTEMGAIN, POT and PIN is scaled in dB (step 614). The SYSTEMGAIN is stored in a memory (step 616).

The pseudo-envelope LUT generating algorithm then determines if a last measurement data word has been processed (step 618). If no, then another measurement data word is retrieved (step 608) and steps 610, 612, 614, 616, and 618 are repeated. If a last measurement data word is determined to have been processed (step 618), then a Vcc/PIN curve for an isogain target is computed using SYSTEMGAIN calculations (STEP 620). Next, VIN/IQ values from the Vcc/PIN curve are derived to generate a pseudo-envelope LUT (step 622). The pseudo-envelope LUT is then transferred to the phone being calibrated (step 624).

Figure 14:
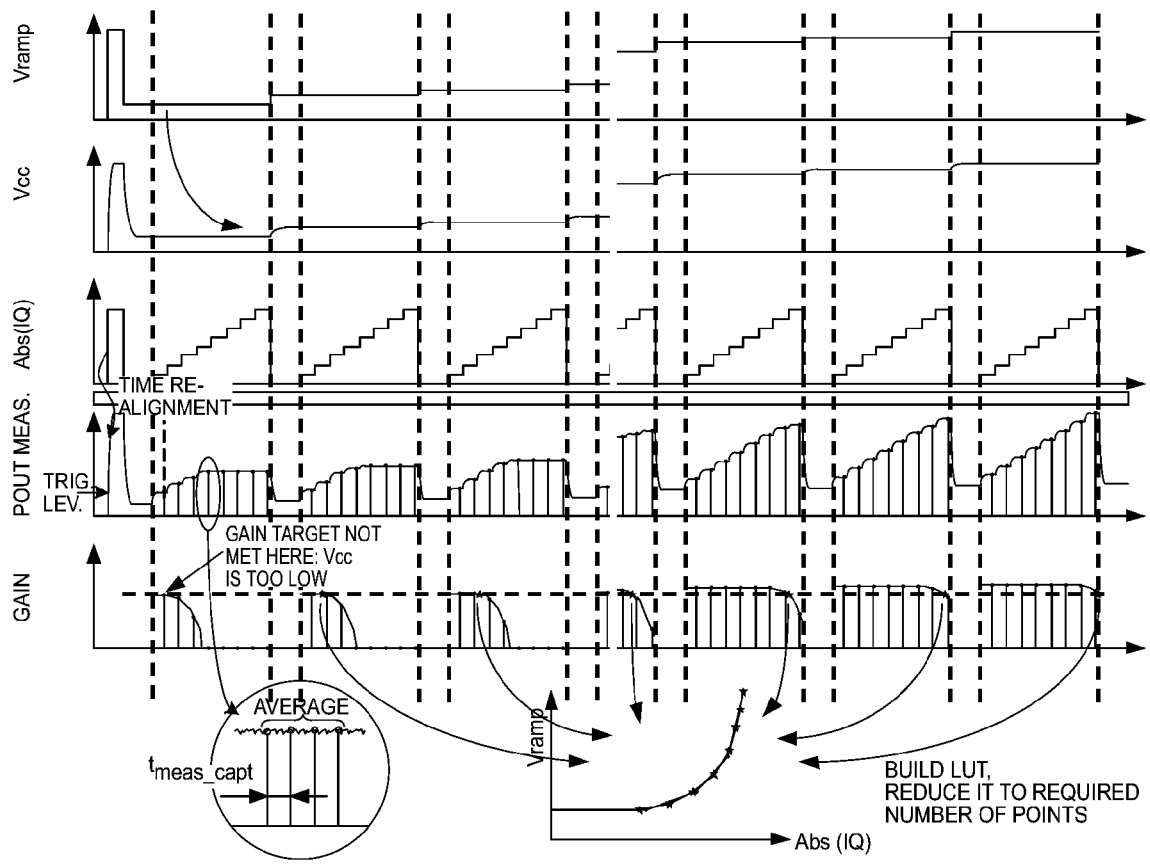
FIG. 14 is a diagram of waveforms generated by a non-pulsed RF 2D sweep algorithm that uses a synchronization pulse when the use of a calibrated RF detector is not available.

FIG. 14 is a diagram of waveforms generated by a non-pulsed RF 2D sweep algorithm that uses a synchronization pulse when the use of a calibrated RF detector is not available. In this way, external test equipment will detect a relatively large RF pulse that indicts that 2D sweep algorithm has commenced and that can trigger the test equipment (not shown).

Figure 15:
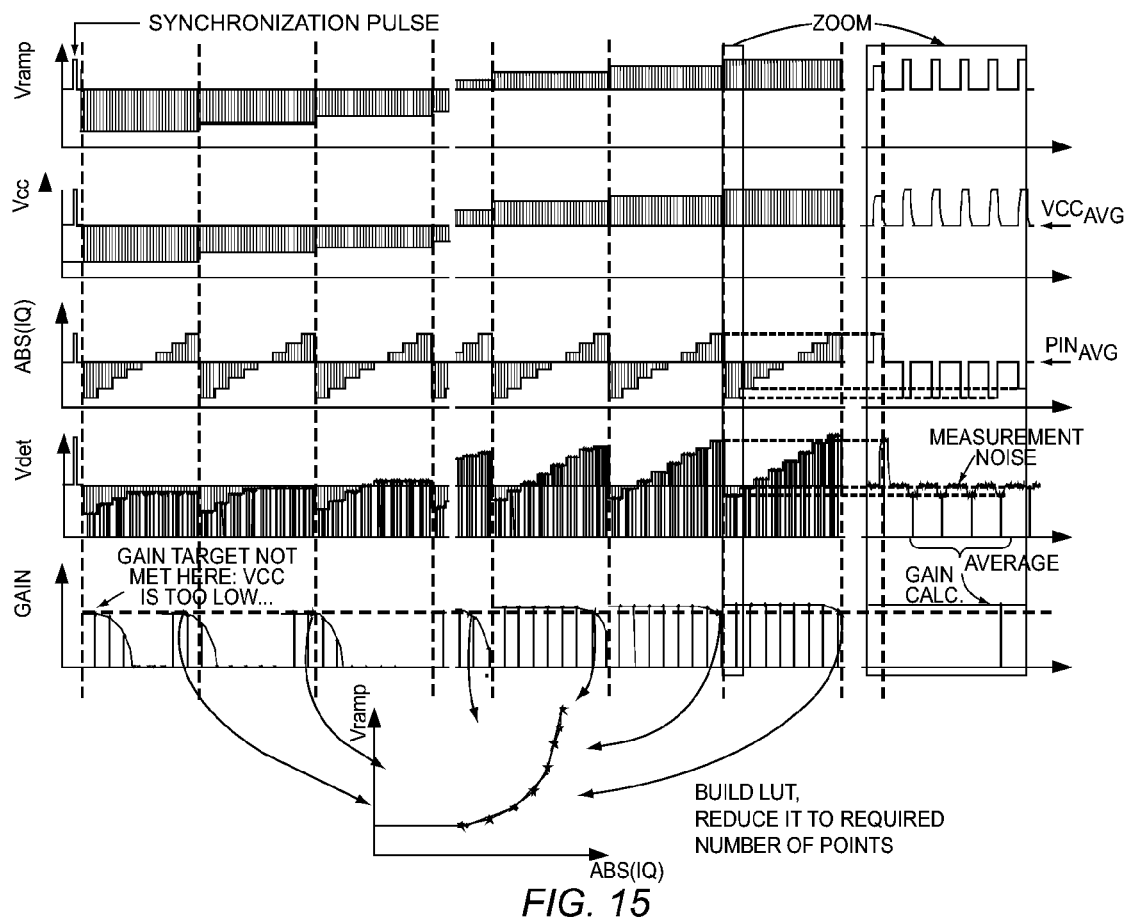
FIG. 15 is a diagram of waveforms generated using a pulsed RF 2D sweep algorithm that uses a synchronization pulse when the use of an RF detector is not available.

FIG. 15 is a diagram of waveforms generated using a pulsed RF 2D sweep algorithm that uses a synchronization pulse when the use of an RF detector is not available. The synchronization pulse is generated just before the start of an actual Vramp/PIN test waveform in such a way output power is high enough. In this way, external test equipment will detect a relatively large RF pulse that indicts that 2D sweep algorithm has commenced and that can trigger the test equipment (not shown).

Figure 16:
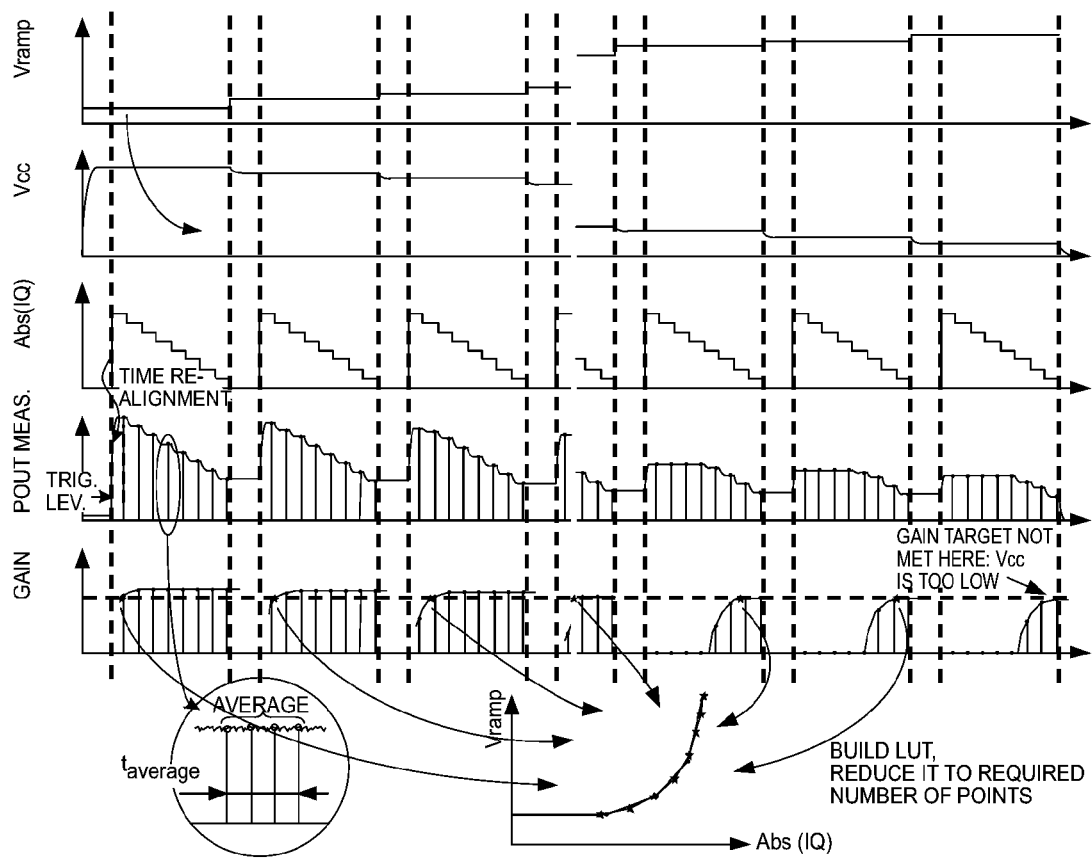
FIG. 16 is a diagram of waveforms generated using a non-pulsed RF 2D sweep algorithm that starts at a maximum RF power output and ends at a minimum RF power output.

FIG. 16 is a diagram of waveforms generated using a non-pulsed 2D sweep algorithm that starts at a high Vcc and a high VIN and decrements sequentially downward to a low Vcc and a low VIN. In this way, no synchronization pulse is needed. Instead, the 2D sweep starts at a maximum RF power output and ends at a minimum RF power output. As such, external test equipment is inherently triggered and synchronized with the 2D sweep algorithm.

Figure 17:
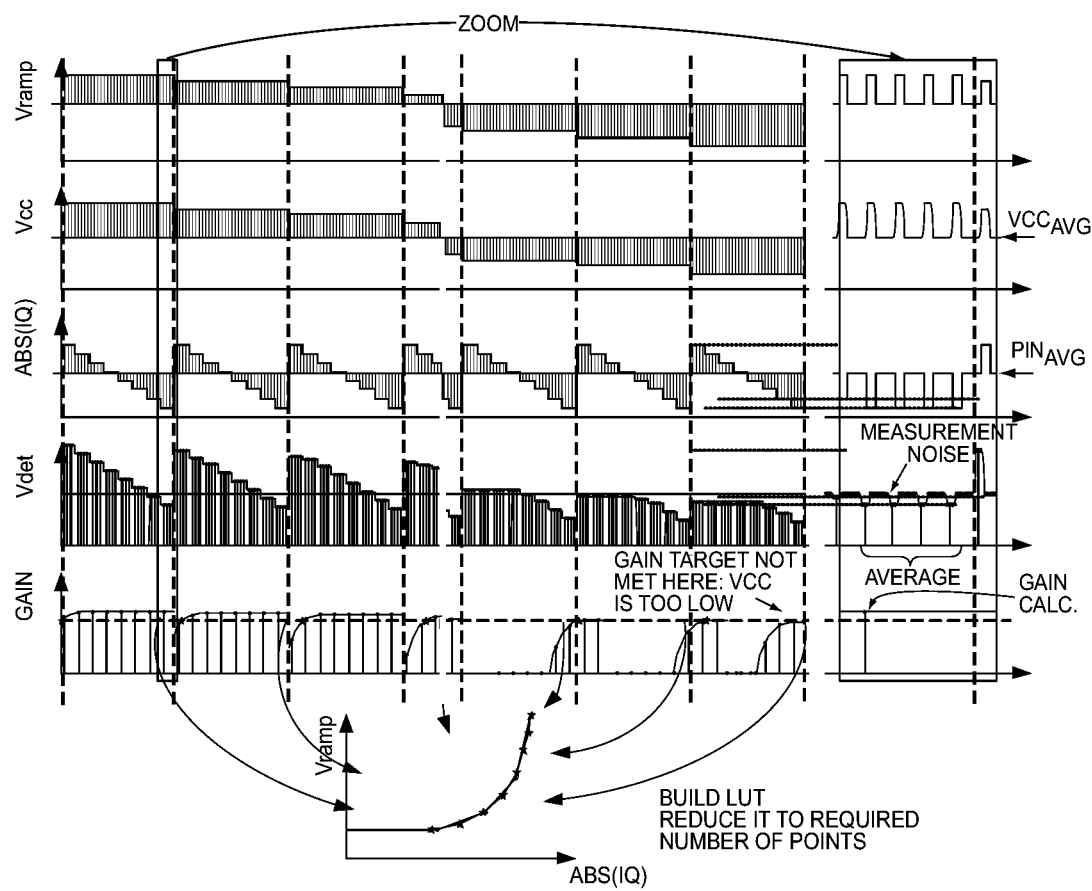
FIG. 17 is a diagram of waveforms generated by a pulsed RF 2D sweep algorithm in which RF output starts at a maximum and ramps to a minimum.
Figure 18:
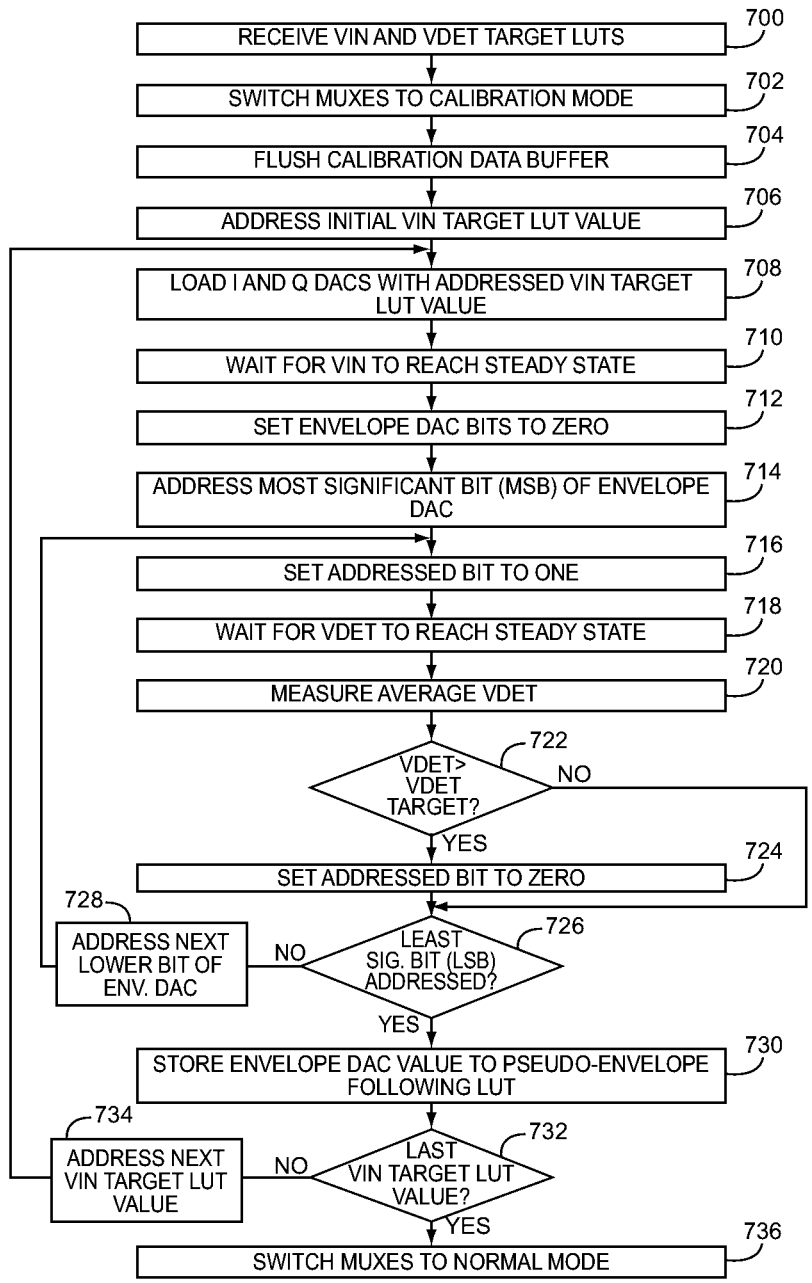
FIG. 18 is a flowchart of a non-pulsed 2D sweep algorithm that implements a successive approximation calibration procedure.

FIG. 17 is a diagram of waveforms generated by a pulsed RF 2D sweep algorithm in which an RF output starts at a maximum and ramps to a minimum. In this way, no synchronization pulse is needed, FIG. 18 is a flowchart of a 2D sweep algorithm that implements a successive approximation calibration procedure that is executable by the calibration subsystem 52 (FIG. 2). For the purpose of this disclosure the terms successive approximation and binary search are equivalent terms. The 2D sweep algorithm begins after VIN and VDET target LUTs are received by a phone (not shown) that includes the calibration subsystem 52 (step 700). After receiving the target LUTs, the calibration subsystem 52 switches the I/Q multiplexer 24 and the envelope multiplexer 44 from normal mode to calibration mode (step 702).

The calibration data buffer 54 (FIG. 2) is flushed to clear old data in preparation of storing new data (step 704). An address for the initial VIN target LUT value is determined (step 706). The I DAC and the Q DAC are loaded with the addressed VIN target LUT value (step 708). The 2D sweep algorithm then waits for VIN to reach steady state (step 710).

In preparation for the successive approximation procedure, bits making up the value for the envelope DAC are set to zero (step 712). Next, the most significant bit (MSB) of the envelope DAC is addressed (step 714) and the addressed envelope DAC bit is set to one (step 716). The successive approximation algorithm then waits for the detector voltage VDET to reach steady state (step 718). Once VDET steady state is reached, the output power is measured (step 720).

The successive approximation algorithm then determines if the measured VDET is greater than the VDET target (step 722). If yes, the addressed bit is set to zero (step 724). If no, the successive approximation algorithm determines if the least significant bit (LSB) of the envelope DAC is addressed (step 726). If no, the next lower bit of the envelope DAC is addressed (step 728) and steps 716, 718, 720, and 722 are repeated. If the successive approximation algorithm determines that the LSB of the envelope detector has been addressed, the envelope DAC value is stored to a pseudo-envelope following LUT (step 730).

Next, the successive approximation algorithm determines if the last VIN target LUT value has been reached (step 732). If not, the next VIN target LUT value is addressed (step 734) and steps 708 through 722 are repeated. Conversely, if the last VIN target LUT value has been processed, the calibration subsystem 52 switches the I/Q multiplexer 24 and the envelope multiplexer 44 from calibration mode to normal mode (step 736).

Figure 19A:
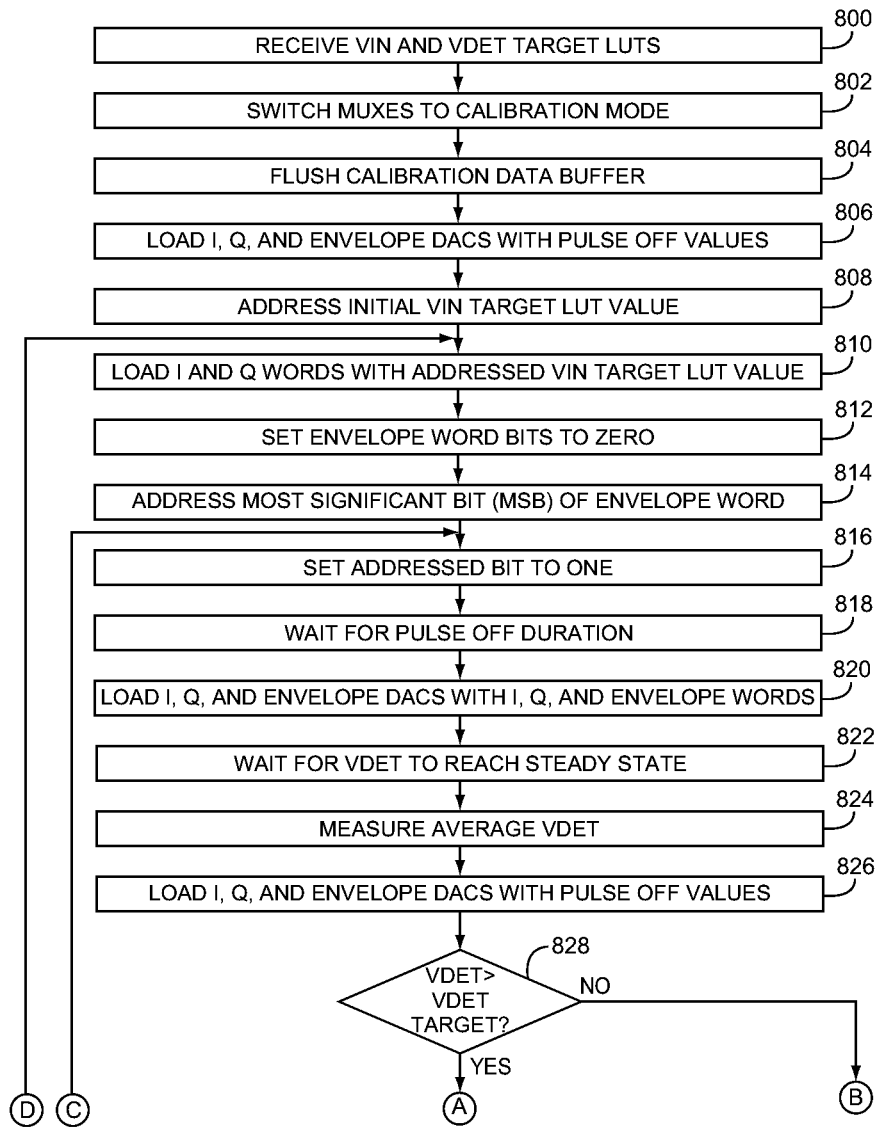
FIGS. 19A and 19B depict a flowchart of an RF pulsed algorithm that implements a successive approximation calibration procedure.
Figure 19B:
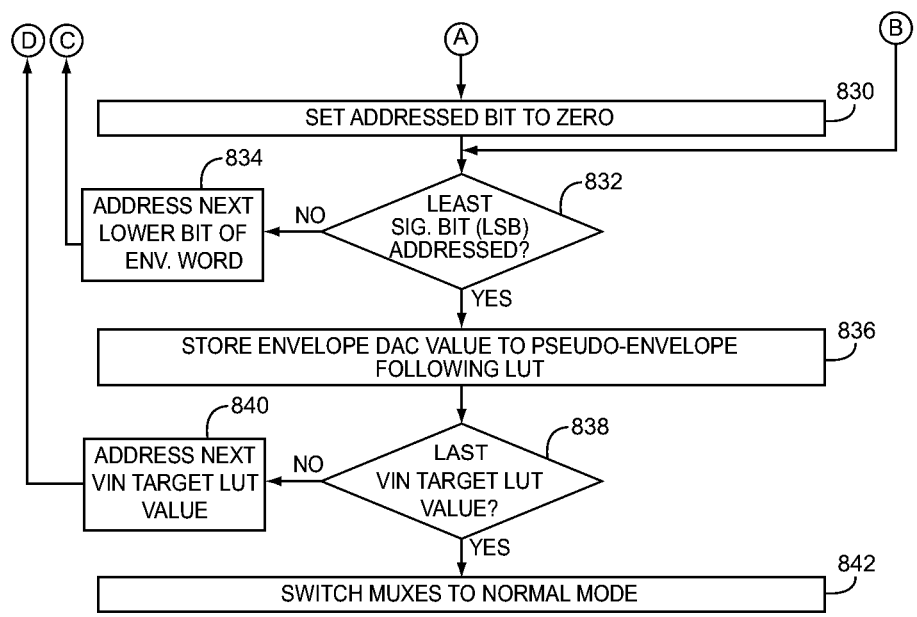

FIGS. 19A and 19B depict a flowchart of an RF pulsed successive approximation algorithm that implements a successive approximation calibration procedure. The successive approximation algorithm begins after VIN and VDET target LUTs are received by a phone (not shown) that includes the calibration subsystem 52 (step 800). After receiving the target LUTs, the calibration subsystem 52 switches the I/Q multiplexer 24 and the envelope multiplexer 44 from normal mode to calibration mode (step 802).

The calibration data buffer 54 (FIG. 2) is flushed to clear old data in preparation of storing new data (step 804). The I, Q, and envelope DACs are then loaded with pulse off values (step 806). An address for the initial VIN target LUT value is determined (step 808). The I DAC and the Q DAC words are loaded with the addressed VIN target LUT value (step 810).

In preparation for the successive approximation procedure, bits making up the value for the envelope word are set to zero (step 812). Next, the most significant bit (MSB) of the envelope word is addressed (step 814) and set the addressed envelope word bit to one (step 816). The successive approximation algorithm then waits for a pulse off duration (step 818). The I, Q, and envelope DACs are loaded with I, Q, and envelope words (step 820). The successive approximation algorithm then waits for VDET to reach steady state (step 822). Once VDET steady state is reached, the average VDET is measured (step 824). Next, the I, Q, and envelope DACs are loaded with pulse off values (step 826).

The successive approximation algorithm then determines if the measured VDET is greater than the VDET target (step 828). If yes, the addressed bit is set to zero (step 830). If no, the successive approximation algorithm determines if the least significant bit (LSB) of the envelope DAC is addressed (step 832). If no, the next lower bit of the envelope word is addressed (step 834) and steps 816, 818, 820, 822, 824, 826 and 828 are repeated. If the successive approximation algorithm determines that the measured VDET is greater than the VDET target (step 828) while the LSB of the envelope word is addressed (832), the envelope DAC value is stored to a pseudo-envelope following LUT (step 836).

Next, the successive approximation algorithm determines if the last VIN target LUT value has been reached (step 838). If not, the next VIN target LUT value is addressed (step 840) and steps 810 through 838 are repeated. Conversely, if the last VIN target LUT value has been processed, the calibration subsystem 52 switches the I/Q multiplexer 24 and the envelope multiplexer 44 from calibration mode to normal mode (step 842).

Figure 20:
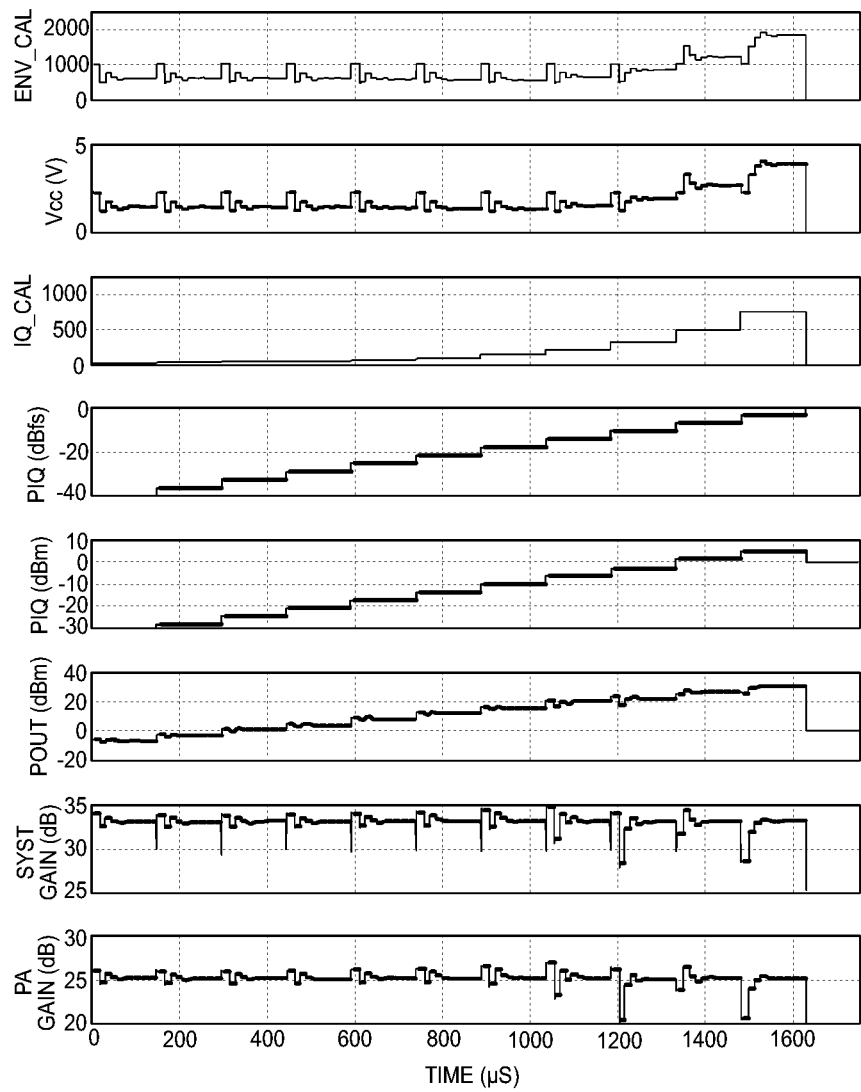
FIG. 20 is a diagram of waveforms that are produced as a result of an execution of a non-pulsed algorithm implementing the successive approximation calibration procedure.

FIG. 20 is a diagram of waveforms that are produced as a result of an execution of the non-pulsed RF successive approximation algorithm depicted by the flowchart of FIG. 18. The waveforms include power IQ (PIQ) measured in decibels full scale (dBfs) and decibels relative to a milliwatt (dBm).

Figure 21:
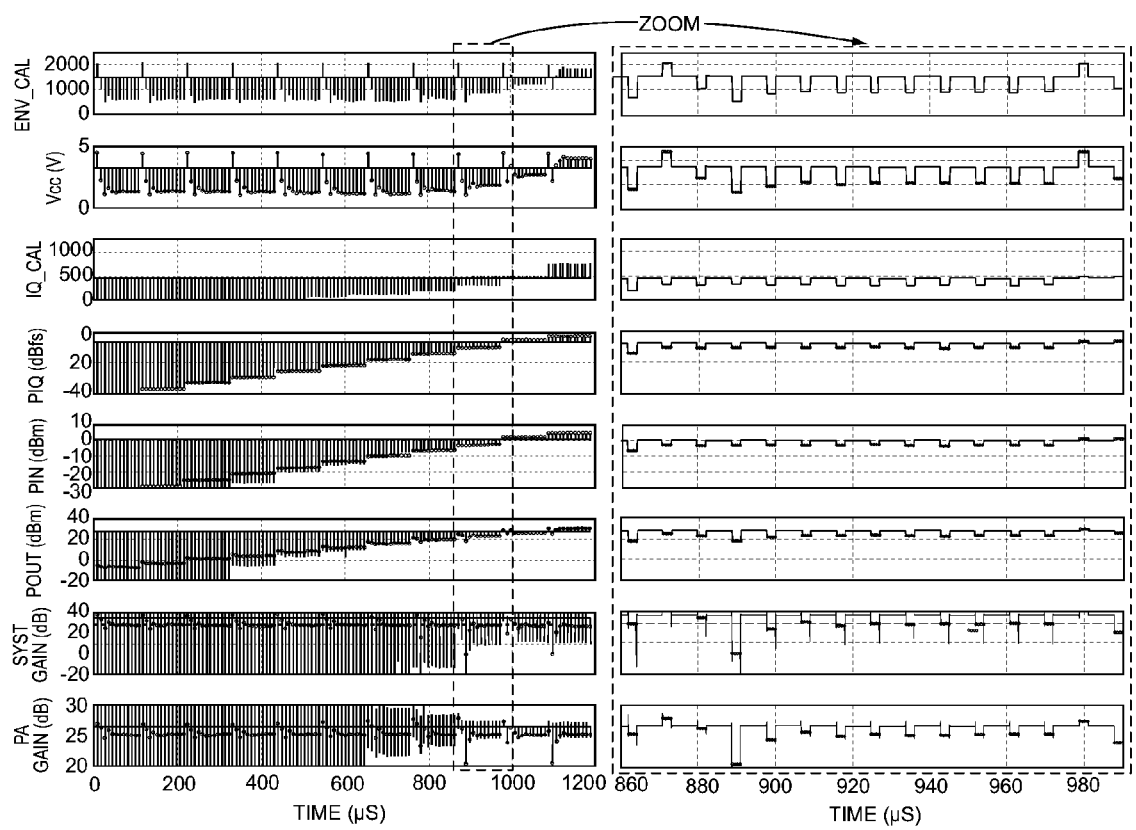
FIG. 21 is a diagram of waveforms that are produced as a result of an execution of the successive approximation depicted by the flow chart of FIGS. 19A and 19B.

FIG. 21 is a diagram of waveforms that are produced as a result of an execution of the pulsed RF successive approximation algorithm depicted by the flowchart of FIGS. 19A and 19B. The diagram of waveforms also illustrates pulses generated using successive approximation.

Figure 22A:
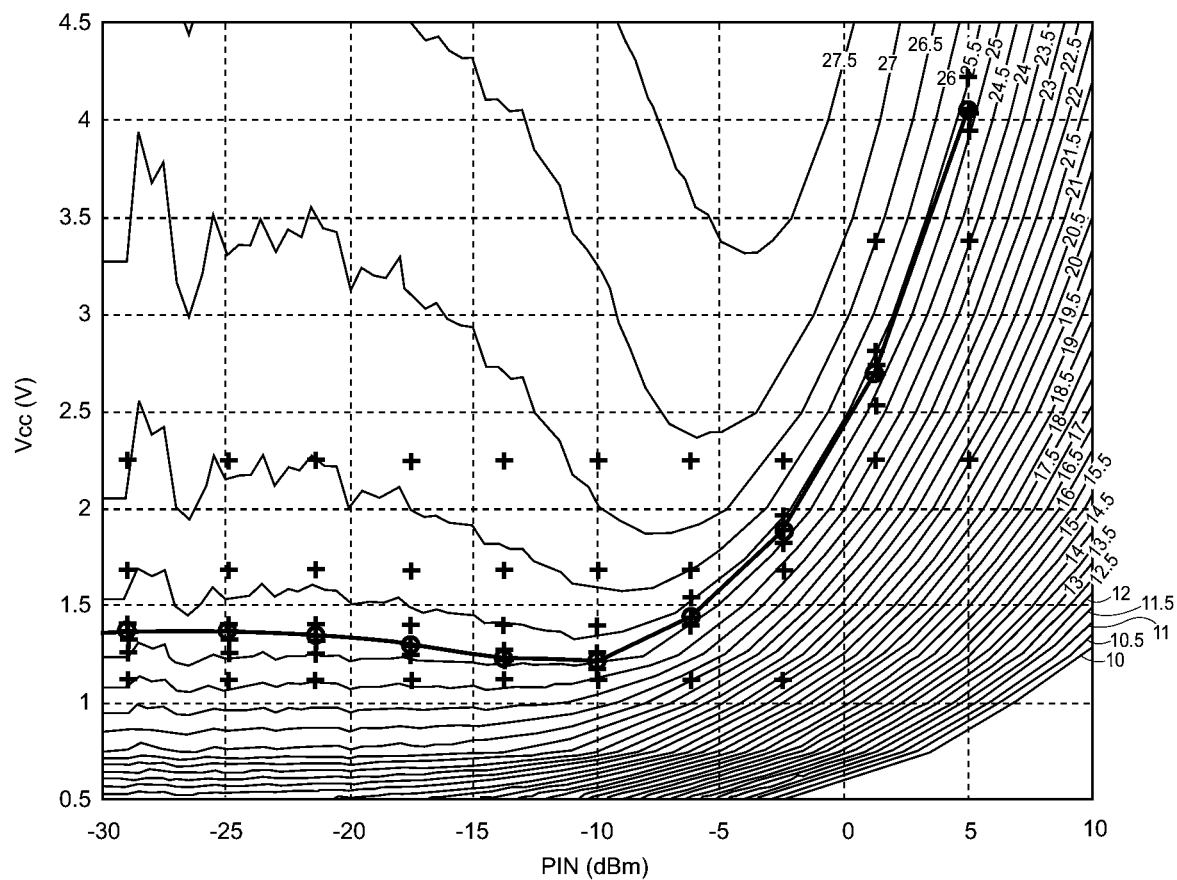
FIG. 22A is a graph of isogain curves for Vcc versus RF input power (PIN) including a successive approximation sweep point distribution.

FIG. 22A is a graph of isogain curves for Vcc versus RF input power (PIN) including a successive approximation sweep point distribution. An isogain curve highlighted as a thick dark line with data points represented by circles is a preferred Vcc/PIN curve to be defined in a pseudo-envelope LUT.

Figure 22B:
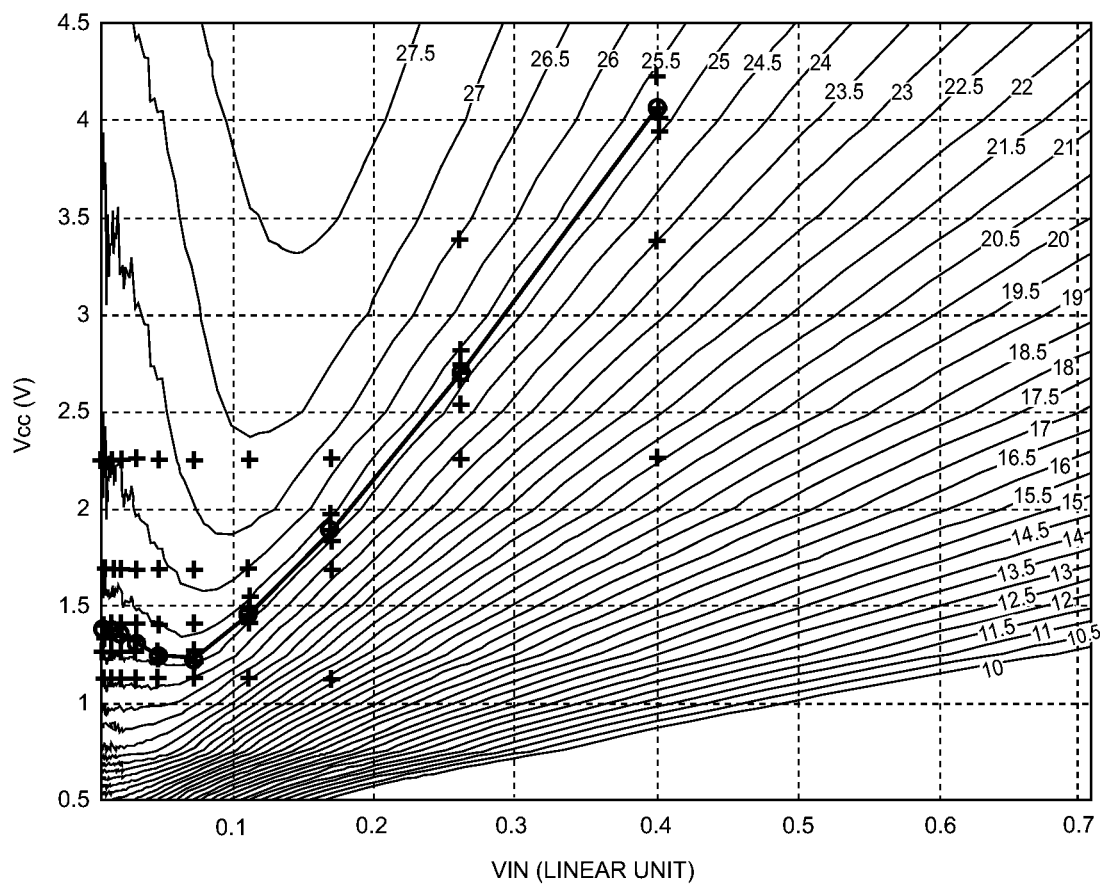
FIG. 22B is a graph of isogain curves for Vcc versus RF input voltage (VIN) including a successive approximation sweep point distribution.

FIG. 22B is a graph of isogain curves for Vcc versus RF input voltage (VIN) including a successive approximation sweep point distribution. The preferred Vcc/PIN curve to be defined in a pseudo-envelope LUT is derived from an isogain curve. The isogain curve is highlighted as a thick dark line with data points represented by circles.

Figure 23:
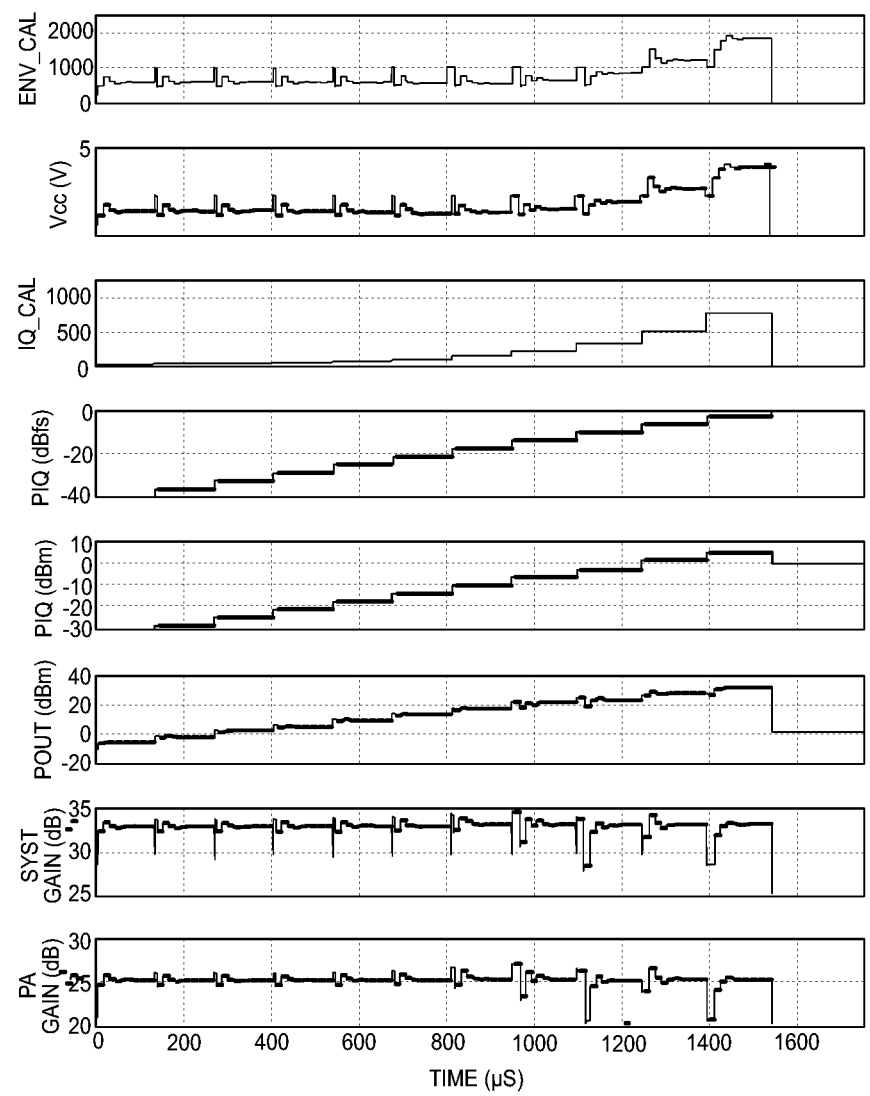
FIG. 23 is a diagram of waveforms that are produced as a result of an execution of the non-pulsed RF algorithm implementing a bounded successive approximation calibration procedure.

FIG. 23 is a diagram of waveforms that are produced as a result of an execution of a non-pulsed RF algorithm implementing a bounded successive approximation calibration procedure. It is to be understood that while this particular non-pulsed RF algorithm completes a calibration within 1600 μS, other successive approximation algorithms can complete a calibration in more or less time without deviating from the scope of the present disclosure.

Figure 24:
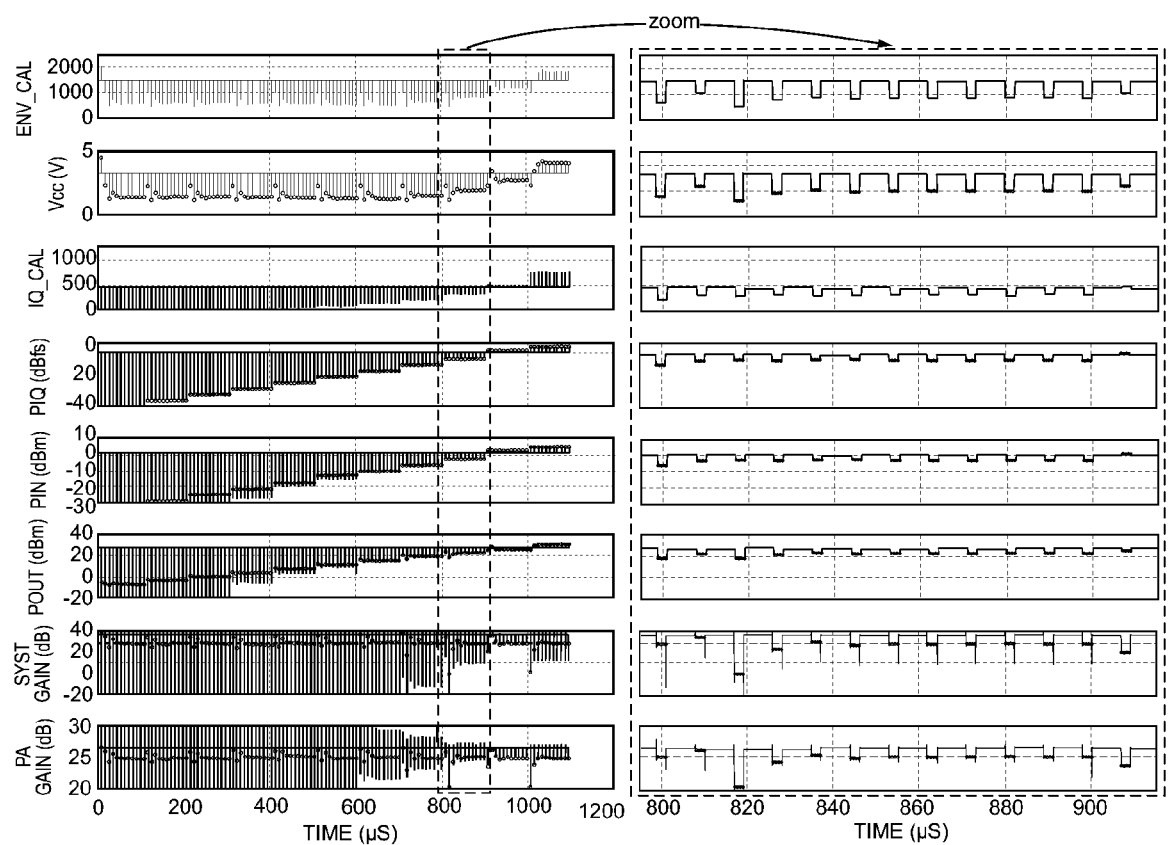
FIG. 24 is a diagram of waveforms that are produced as a result of an execution of a bounded pulsed RF successive approximation algorithm.

FIG. 24 is a diagram of waveforms that are produced as a result of an execution of a bounded pulsed RF successive approximation algorithm. The diagram of waveforms also illustrates pulses generated using bounded successive approximation.

Figure 25A:
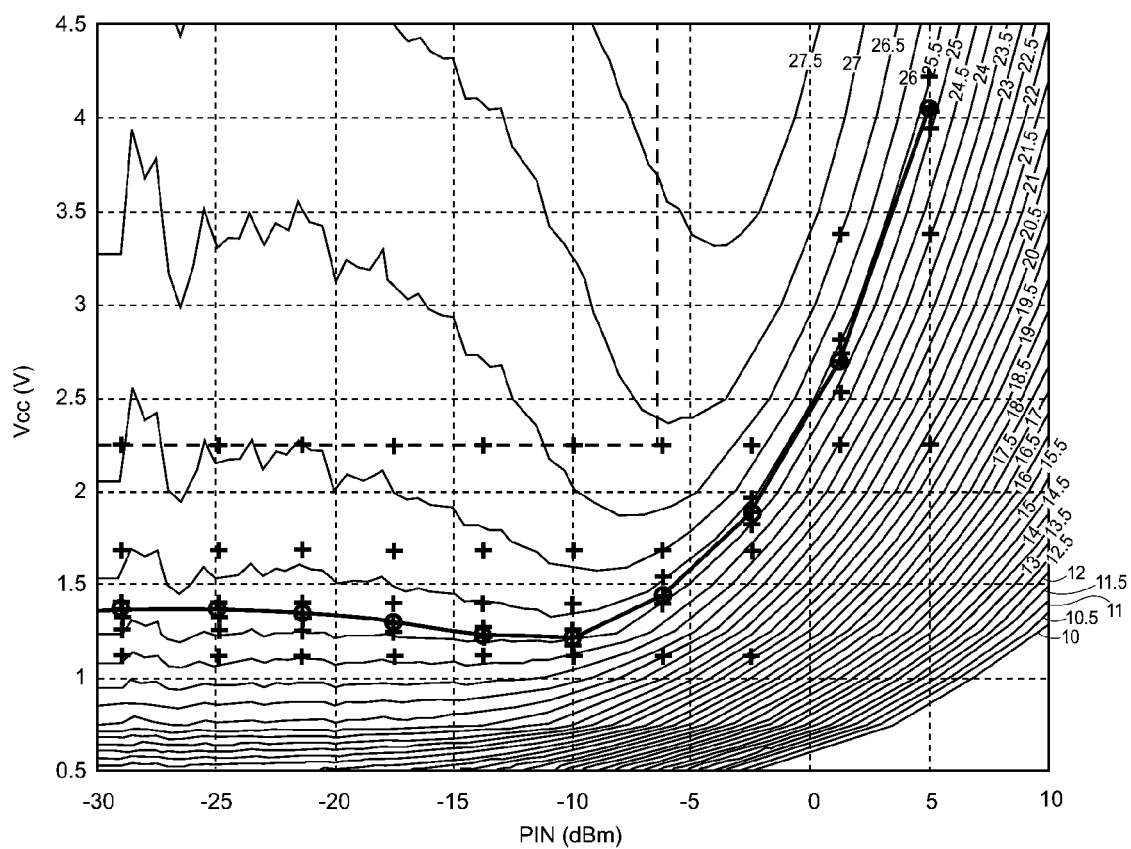
FIG. 25A is a graph of isogain curves for Vcc versus RF input power (PIN) including a bounded successive approximation sweep point distribution.
Figure 25B:
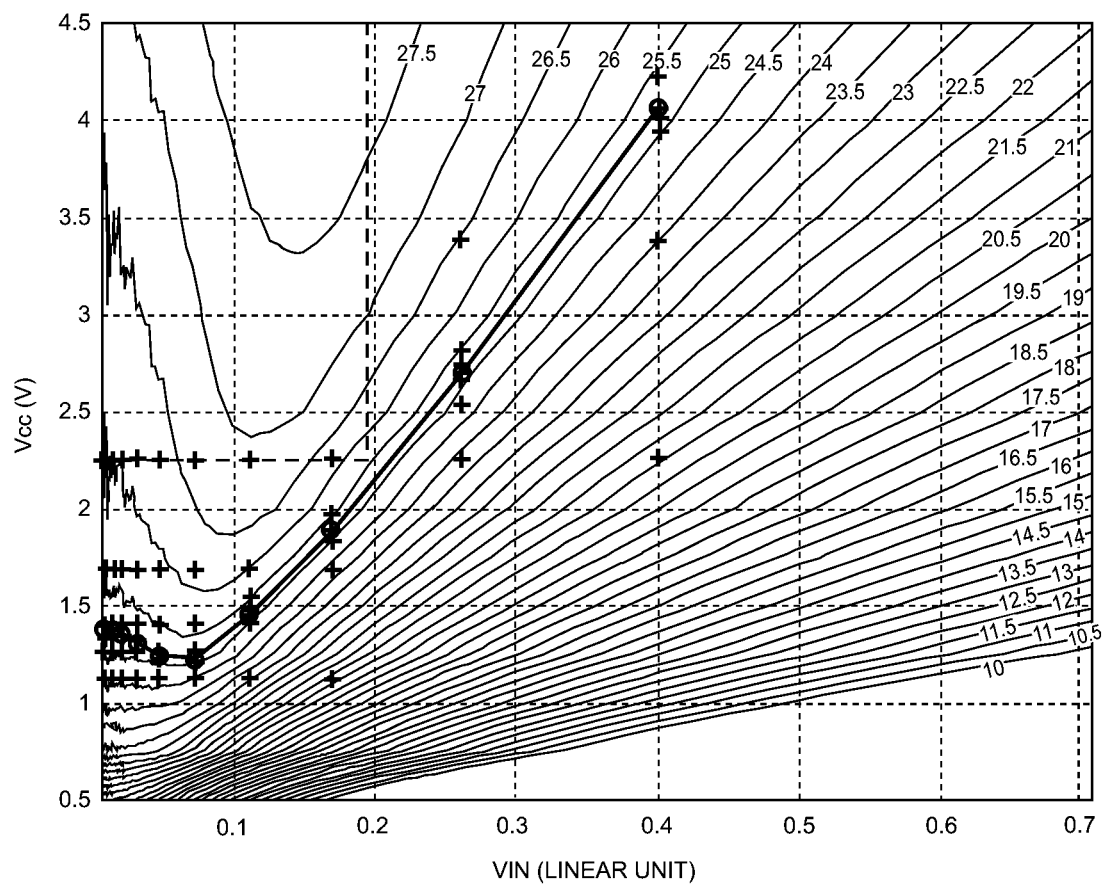
FIG. 25B is a graph of isogain curves for Vcc versus RF input voltage (VIN) including a bounded successive approximation sweep point distribution.

FIG. 25A is a graph of isogain curves for Vcc versus RF input power (PIN) including a bounded successive approximation sweep point distribution. FIG. 25B is a graph of isogain curves for Vcc versus RF input voltage (VIN) including a bounded successive approximation sweep point distribution. Boundaries for the successive approximations are defined by piecewise lines shown in the graphs of isogain curves of FIGS. 17A and 17B by dark dashed lines.

Those skilled in the art will recognize improvements and modifications to the preferred embodiments of the present disclosure. All such improvements and modifications are considered within the scope of the concepts disclosed herein and the claims that follow.

What is claimed is:

1. A transceiver for an envelope following system that includes a power amplifier (PA) having a signal input, a signal output, and a power input that receives power from a power management system that modulates a supply voltage provided to the PA in response to an envelope signal, the transceiver comprising:
   calibration circuitry adapted to provide a first test signal to the signal input of the PA and to provide a second test signal to the power management system in place of the envelope signal; and
   a calibration subsystem adapted to control the calibration circuitry to sweep the first test signal through a first range and to sweep the second test signal through a second range.

2. The transceiver of claim 1 further including a power measurement circuit adapted to measure power associated with the signal output of the PA as the PA responds to the first test signal and the second test signal.

3. The transceiver of claim 2 further including a memory for storing power measurement data points along with corresponding data points of the first test signal and corresponding data points of the second test signal.

4. The transceiver of claim 1 wherein the calibration subsystem includes a program to linearly sweep the first range from a predetermined initial data point to a predetermined final data point.

5. The transceiver of claim 1 wherein the calibration subsystem includes a program to linearly sweep the second range from a predetermined initial data point to a predetermined final data point.

6. The transceiver of claim 1 wherein the calibration subsystem includes a program to exponentially sweep the first range from a predetermined initial data point to a predetermined final data point.

7. The transceiver of claim 1 wherein the calibration subsystem includes a program to exponentially sweep the second range from a predetermined initial data point to a predetermined final data point.

8. The transceiver of claim 1 wherein the calibration circuitry includes an in-phase/quadrature (I/Q) multiplexer that is adapted to switch the I/Q multiplexer between a normal mode in which I/Q signals pass from an I/Q digital modulator to an I digital-to-analog converter (DAC) and a Q DAC and a calibration mode that passes calibration signals to the I DAC and Q DAC in place of the I/Q signals.

9. The transceiver of claim 8 wherein the calibration circuitry includes an envelope multiplexer to pass an envelope signal from an envelope calculator to an envelope DAC in the normal mode and to pass a calibration signal from the calibration subsystem to the envelope DAC in place of the envelope signal while in the calibration mode.

10. A method of calibrating a pseudo-envelope system having a transceiver with an in-phase/quadrature (I/Q) digital modulator and calibration circuitry that includes an I/Q multiplexer coupled to an in-phase (I) digital-to-analog converter (DAC) and a quadrature (Q) DAC, an envelope multiplexer coupled to an envelope DAC, and a calibration subsystem that is adapted to switch the I/Q multiplexer between a normal mode in which I/Q signals pass from the I/Q digital modulator to the I DAC and the Q DAC and an envelope signal passes from an envelope calculator and a calibration mode in which calibration signals pass from the calibration subsystem to the I DAC, the Q DAC and the envelope DAC in place of the I/Q signals and the envelope signal, comprising:
  switching the I/Q multiplexers and envelope multiplexer from the normal mode to the calibration mode;
  sweeping the calibration signals through predetermined ranges while measuring average power amplifier (PA) power and storing average PA power measurements in a data buffer; and
  switching the I/Q multiplexers and the envelope multiplexer from the normal mode to the calibration mode.

11. The method of claim 10 wherein sweeping the calibration signals through predetermined ranges is performed linearly.

12. The method of claim 10 wherein sweeping the calibration signals through predetermined ranges is performed exponentially.

13. The method of claim 10 wherein the predetermined ranges are defined by piecewise linear boundaries.

14. The method of claim 10 wherein sweeping the calibration signals through predetermined ranges begins with generating a predetermined minimum envelope voltage.

15. The method of claim 14 wherein sweeping the calibration signals includes a synchronization pulse that is usable to trigger external PA power recording equipment.

16. The method of claim 10 wherein sweeping the calibration signals through predetermined ranges begins with generating a predetermined maximum voltage that provides a maximum RF output power.

17. The method of claim 10 further including receiving a pseudo-envelope look-up table (LUT) that is derived from the PA power measurements.

18. The method of claim 10 wherein the transceiver further includes a calibrated detector for measuring the PA power.

19. The method of claim 18 wherein the sweeping the calibration signals through predetermined ranges is performed using successive approximation of envelope voltage to calibrate pre-established values of a pseudo-envelope LUT included with the transceiver.

20. The method of claim 19 further including an input voltage (VIN) LUT having pre-defined values that are autonomously searched by the calibration subsystem for each of the pre-established values of the pseudo-envelope LUT.

21. The method of claim 10 further including sweeping a first calibration signal through a first predetermined range linearly and sweeping a second calibration signal through a second predetermined range exponentially.

22. The method of claim 10 wherein sweeping the calibration signals through predetermined ranges begins with generating a predetermined maximum envelope voltage.

* * * * *